US009799570B1

(12) United States Patent
Cheng

(10) Patent No.: US 9,799,570 B1
(45) Date of Patent: Oct. 24, 2017

(54) FABRICATION OF VERTICAL FIELD EFFECT TRANSISTORS WITH UNIFORM STRUCTURAL PROFILES

(71) Applicant: International Business Machines Corporation, Armonk, NY (US)

(72) Inventor: Kangguo Cheng, Schenectady, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 15/430,766

(22) Filed: Feb. 13, 2017

(51) Int. Cl.
*H01L 21/8238* (2006.01)
*H01L 29/06* (2006.01)
(Continued)

(52) U.S. Cl.
CPC ........ *H01L 21/823878* (2013.01); *H01L 21/02532* (2013.01); *H01L 21/02592* (2013.01); *H01L 21/02595* (2013.01); *H01L 21/02598* (2013.01); *H01L 21/3065* (2013.01); *H01L 21/30604* (2013.01); *H01L 21/823807* (2013.01); *H01L 21/823814* (2013.01); *H01L 21/823828* (2013.01); *H01L 21/823885* (2013.01); *H01L 27/092* (2013.01); *H01L 29/0649* (2013.01); *H01L 29/42392* (2013.01);
(Continued)

(58) Field of Classification Search
CPC ....... H01L 21/823878; H01L 21/02532; H01L 21/02592; H01L 21/02595; H01L 21/02598; H01L 21/30604; H01L 21/3065; H01L 21/823807; H01L 21/823814; H01L 21/823828; H01L 21/823885; H01L 27/092; H01L 29/0649; H01L 29/42392; H01L 21/78618; H01L 29/78642; H01L 29/78651; H01L 29/78696; H01L 29/66712; H01L 29/7802
See application file for complete search history.

(56) References Cited

U.S. PATENT DOCUMENTS 6,660,590 B2   12/2003   Yoo
6,846,709 B1   1/2005   Lojek
(Continued)

*Primary Examiner* — Walter H Swanson
(74) *Attorney, Agent, or Firm* — Vazken Alexanian; Ryan, Mason & Lewis, LLP

(57) ABSTRACT

Semiconductor devices are fabricated with vertical field effect transistor (FET) devices having uniform structural profiles. Semiconductor fabrication methods for vertical FET devices implement a process flow to fabricate dummy fins within isolation regions to enable the formation of vertical FET devices with uniform structural profiles within device regions. Sacrificial semiconductor fins are formed in the isolation regions concurrently with semiconductor fins in the device regions, to minimize/eliminate micro-loading effects from an etch process used for fin patterning and, thereby, form uniform profile semiconductor fins. The sacrificial semiconductor fins within the isolation regions also serve to minimize/eliminate non-uniform topography and micro-loading effects when planarizing and recessing conductive gate layers and, thereby, form conductive gate structures for vertical FET devices with uniform gate lengths in the device regions. The sacrificial semiconductor fins are subsequently removed and replaced with insulating material to form the dummy fins.

9 Claims, 18 Drawing Sheets

(51) Int. Cl.
  *H01L 29/423*   (2006.01)
  *H01L 29/786*   (2006.01)
  *H01L 27/092*   (2006.01)
  *H01L 21/02*    (2006.01)
  *H01L 21/3065*  (2006.01)
  *H01L 21/306*   (2006.01)

(52) U.S. Cl.
  CPC .. *H01L 29/78618* (2013.01); *H01L 29/78642* (2013.01); *H01L 29/78651* (2013.01); *H01L 29/78696* (2013.01)

(56) References Cited

U.S. PATENT DOCUMENTS

| | | |
|---|---|---|
| 7,033,877 B2 | 4/2006 | Chaudhry et al. |
| 8,697,515 B2 | 4/2014 | Yin et al. |
| 9,245,885 B1 | 1/2016 | Xie et al. |
| 9,252,022 B1 | 2/2016 | Dechene et al. |
| 9,269,629 B2 | 2/2016 | Cheng et al. |
| 9,378,948 B2 | 6/2016 | Cheng et al. |
| 2005/0077553 A1 | 4/2005 | Kim et al. |
| 2014/0097518 A1* | 4/2014 | Cheng ................ H01L 29/0649 257/618 |
| 2016/0247677 A1 | 8/2016 | He et al. |
| 2016/0322462 A1* | 11/2016 | Chou ................ H01L 21/30604 |

* cited by examiner

100

US 9,799,570 B1

FABRICATION OF VERTICAL FIELD EFFECT TRANSISTORS WITH UNIFORM STRUCTURAL PROFILES

TECHNICAL FIELD

This disclosure relates generally to semiconductor fabrication techniques and, in particular, to structures and methods for fabricating vertical field effect transistor (FET) devices.

BACKGROUND

Traditional CMOS (complementary metal oxide semiconductor) techniques include process flows for constructing planar FET devices. With planar FETs, increased transistor density can be achieved by decreasing the pitch between transistor gate elements. However, with planar FET devices, the ability to decrease gate pitch is limited by the required gate length and spacer thickness. In recent years, there has been significant research and development with regard to vertical FET devices, which decouple the gate length from the gate pitch requirement and enable scaling of transistor density. In general, vertical FET devices are designed to have gate structures that are formed on multiple sides of a vertical channel structure (e.g., a vertical semiconductor fin or vertical nanowire). In addition, vertical FET devices employ doped source and drain regions, wherein a doped source region for a vertical FET can be formed on top of a vertical semiconductor fin, and wherein a doped drain region can be formed underneath the vertical semiconductor fin. With vertical FET devices, scaling is determined by how close vertical conductive contacts to the source and drain regions can be placed.

In semiconductor devices where different pattern densities of device structures are formed on a semiconductor substrate, the ability to fabricate device structures with uniform structural profiles within the same device region or adjacent device regions is problematic and challenging because of the micro-loading effects of conventional etch and planarizing processes. For example, with vertical FET devices, a gate length of a metal gate is defined by a timed etching of a layer of conductive gate material, typically performed by a reactive ion etch (RIE). Due to the micro-loading effects of the RIE process, there can be a relatively large variation in the gate length of vertical FET devices between dense vertical FET regions and isolated vertical FET regions. Indeed, the metal gate recess level in a given region is dependent, for example, on the pattern density of vertical semiconductor fins (e.g., pitch) within the given region, where the conductive gate layer may be recessed deeper in regions of the semiconductor substrate having relaxed-pitch vertical semiconductor fin patterns as compared to regions of the semiconductor substrate having tight-pitch vertical semiconductor fin patterns. Even within the same device region, gate length variation can occur between vertical FET devices formed within a center region of a given device region and vertical FET devices formed at the edges of the given device region.

Another issue with conventional vertical FET device fabrication is the initial variation in thickness of a planarized layer of conductive gate material (prior to the gate recess), which results from dishing effects that can result from chemical mechanical polishing (CMP). The micro-loading effects of conventional etch and planarizing processes during vertical FET device fabrication can result in undesired variation in device dimensions, which leads to undesired variation in device performance.

SUMMARY

Embodiments of the invention include methods for fabricating vertical FET devices with uniform structural profiles, as well as semiconductor devices comprising vertical FET devices with uniform structure profiles.

For example, one embodiment of the invention includes a method for fabricating a semiconductor device. The method comprises forming a substrate comprising a lower source/drain layer disposed between a base semiconductor substrate and a first layer of semiconductor material. A shallow trench isolation (STI) layer is formed through a portion of the first layer of semiconductor material, the lower source/drain layer and into an upper portion of the semiconductor substrate to form an isolation region, wherein the isolation region defines a first device region comprising a first lower source/drain region and a second device region comprising a second lower source/drain region. The STI layer is recessed, and a second layer of semiconductor material is formed on the recessed STI layer in the isolation region. The first and second layers of semiconductor material are concurrently patterned using a first etch process to form an array of vertical semiconductor fins in the first and second device regions and the isolation region. A lower insulating spacer is formed on the first and second lower source/drain regions and the STI layer. A conductive gate structure is formed on the lower insulating spacer and surrounding sidewalls of the vertical semiconductor fins in the first and second device regions and the isolation region. An upper insulating spacer is formed on the conductive gate structure. The vertical semiconductor fins in the isolation region are then etched away using a second etch process which is selective to the vertical semiconductor fins in the first and second device regions, to form trenches down to the STI layer in the isolation region. The trenches in the isolation region are filled with an insulating material to form vertical dummy fins in the isolation region.

Another embodiment includes a semiconductor device. The semiconductor device comprises: a first vertical FET device formed in a first device region of a substrate, wherein the first vertical FET device comprises vertical semiconductor fins; a second vertical FET device formed in a second device region of the substrate, wherein the second vertical FET device comprises vertical semiconductor fins; an isolation region separating the first and second device regions, wherein the isolation region comprises a STI layer formed in the substrate, and a plurality of vertical dummy fins disposed on the STI layer in the isolation region; and a conductive gate structure disposed around sidewalls of the vertical semiconductor fins of the first and second FET devices in the first and second device regions and around sidewalls of the vertical dummy fins in the isolation region.

Other embodiments will be described in the following detailed description of embodiments, which is to be read in conjunction with the accompanying figures.

BRIEF DESCRIPTION OF THE DRAWINGS

FIGS. 2 through 17 schematically illustrate a method for fabricating the semiconductor device of FIG. 1 according to an embodiment of the invention, wherein:

FIG. 2 is a schematic cross-sectional side view of the semiconductor device at an intermediate stage of fabrication in which a lower source/drain layer and a monocrystalline semiconductor layer are formed on a semiconductor substrate;

FIG. 3 is a schematic cross-sectional side view of the semiconductor structure of FIG. 2 after forming a STI layer that defines an isolation region and separate active device regions;

FIG. 4 is a schematic cross-sectional side view of the semiconductor structure of FIG. 3 after recessing the STI layer down to a lower region of the monocrystalline semiconductor layer;

FIG. 5 is a schematic cross-sectional side view of the semiconductor structure of FIG. 4 after forming a sacrificial semiconductor layer on the recessed STI layer;

FIG. 6 is a schematic cross-sectional side view of the semiconductor structure of FIG. 5 after forming a hardmask layer on the surface of the semiconductor structure;

FIG. 7 is a schematic cross-sectional side view of the semiconductor structure of FIG. 6 after patterning the hardmask layer to form an etch hardmask, and patterning the monocrystalline semiconductor layer and the sacrificial semiconductor layer using the image of the etch hardmask to form an array of vertical semiconductor fins in the isolation and active device regions;

FIG. 8 is a schematic cross-sectional side view of the semiconductor structure of FIG. 7 after forming a lower insulating spacer and a conformal layer of gate dielectric material;

FIG. 9 is a schematic cross-sectional side view of the semiconductor structure of FIG. 8 after depositing and planarizing a layer of conductive material that is used to form a gate electrode layer;

FIG. 10 is a schematic cross-sectional side view of the semiconductor structure of FIG. 9 after recessing the layer of conductive material to form a gate electrode layer with a thickness that defines a gate length of vertical FET devices to be formed in the active device regions;

FIG. 11 is a schematic cross-sectional side view of the semiconductor structure of FIG. 10 after removing exposed portions of the gate dielectric layer on upper portions of the vertical fins in the active device and isolation regions to form a conductive gate structure;

FIG. 12 is a schematic cross-sectional side view of the semiconductor structure of FIG. 11 after forming an upper insulating spacer on an upper surface of the conductive gate structure;

FIG. 13 is a schematic cross-sectional side view of the semiconductor structure of FIG. 12 after depositing a layer of insulating material on the surface of the semiconductor structure and planarizing the surface down to expose the etch hardmask on top of the vertical fins in the active device and isolation regions;

FIG. 14 is a schematic cross-sectional side view of the semiconductor structure of FIG. 13 after removing the etch hardmask to expose upper surfaces of the vertical fins in the active device and isolation regions;

FIG. 15 is a schematic cross-sectional side view of the semiconductor structure of FIG. 14 after removing sacrificial vertical semiconductor fins in the isolation region to form trenches down to the STI layer;

FIG. 16 is a schematic cross-sectional side view of the semiconductor structure of FIG. 15 after filling the trenches with an insulating material to form vertical dummy fins in the isolation region;

FIG. 17 is a schematic cross-sectional side view of the semiconductor structure of FIG. 16 after recessing the insulating material down to a level which exposes upper surfaces of the vertical semiconductor fins in the active device regions and which recesses upper surfaces of the vertical dummy fins in the isolation region to be substantially level with the upper surfaces of the vertical semiconductor fins in the active device regions.

DETAILED DESCRIPTION

Figure 1:
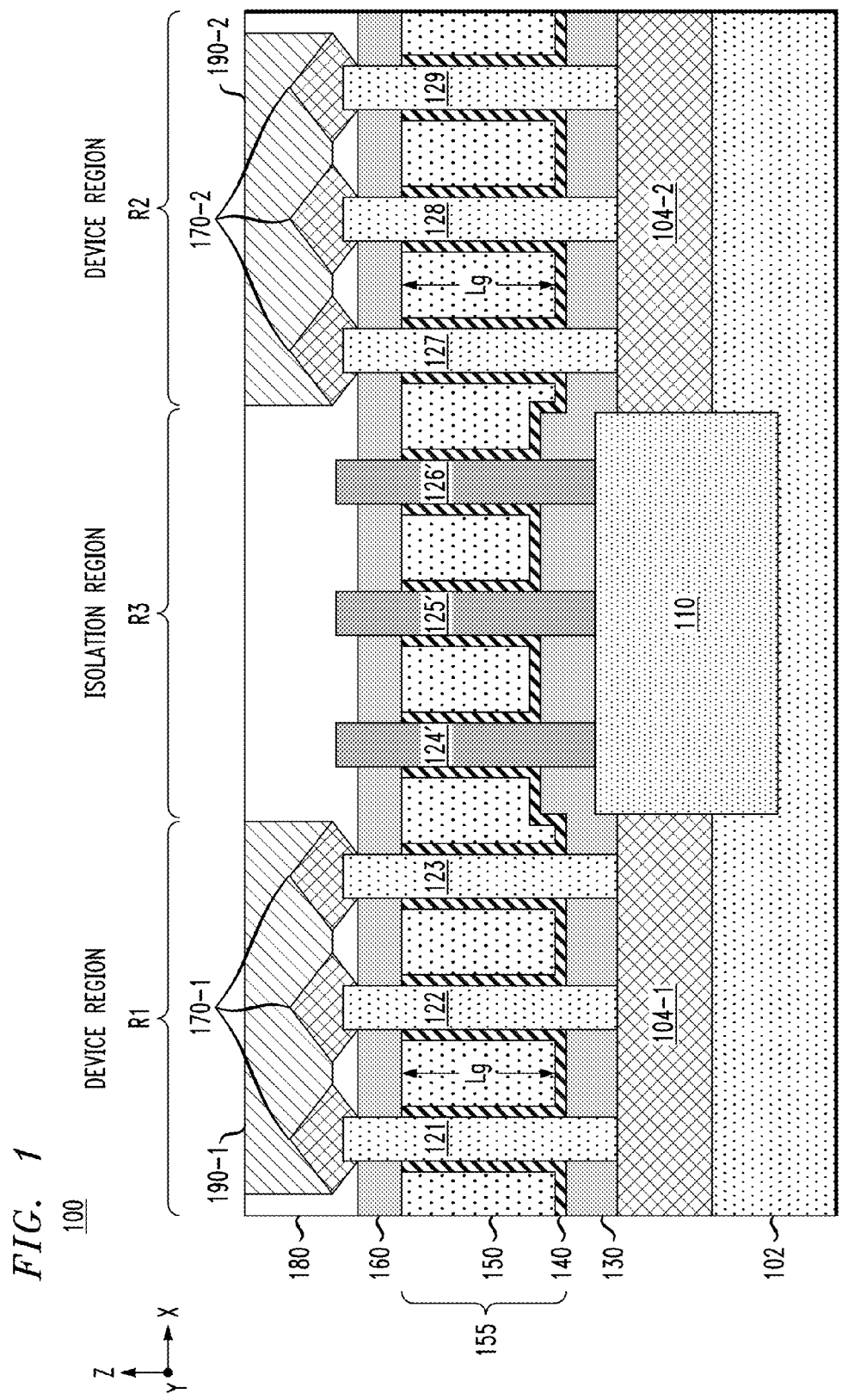
FIG. 1 is a schematic cross-sectional side view of a semiconductor device comprising vertical FET devices, according to an embodiment of the invention.

Embodiments of the invention will now be described with regard methods for fabricating vertical FET devices with uniform structural profiles, as well as semiconductor devices comprising vertical FET devices with uniform structural profiles. Semiconductor fabrication methods for vertical FET devices according to embodiments of the invention implement a process flow to fabricate vertical dummy fins within isolation regions, which enables the formation of vertical FET devices with uniform structural profiles within device regions. For example, as explained in further detail below, a fin patterning process is implemented to form sacrificial vertical semiconductor fins in the isolation regions concurrently with vertical semiconductor fins in the device regions. The concurrent formation of the vertical semiconductor fins in the device and isolation regions serves to minimize/eliminate micro-loading effects of an etch process that is utilized for the fin patterning process, thereby resulting in the formation of uniform vertical semiconductor fins in the device regions. The sacrificial vertical semiconductor fins within the isolation regions also serve to minimize/eliminate non-uniform topography and micro-loading effects when chemical-mechanical planarizing and recessing conductive gate layers, thereby resulting in the formation of conductive gate structures for the vertical FET devices with uniform gate lengths in the device regions. The sacrificial vertical semiconductor fins in the isolation regions are subsequently removed and replaced with insulating material to form the vertical dummy fins.

It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount. Further, the term "vertical" or "vertical direction" or "vertical height" as used herein denotes a Z-direction of the Cartesian coordinates shown in the drawings, and the terms "horizontal," or "horizontal direction," or "lateral direction" as used herein denotes an X-direction and/or Y-direction of the Cartesian coordinates shown in the drawings.

FIG. 1 is a schematic cross-sectional side view of a semiconductor device 100 comprising vertical FET devices, according to an embodiment of the invention. The semiconductor device 100 comprises a base semiconductor substrate 102, lower source/drain regions 104-1 and 104-2, a STI layer 110, a plurality of vertical semiconductor fins 121, 122, 123, 127, 128, and 129, a plurality of vertical dummy fins 124', 125', and 126', a lower insulating spacer 130, a conductive gate structure 155, an upper insulating spacer 160, upper source/drain regions 170-1 and 170-2, an insulating layer 180, and vertical source/drain contacts 190-1 and 190-1. The conductive gate structure 155 comprises a thin gate dielectric layer 140 disposed on sidewalls of the vertical semiconductor fins 121, 122, 123, 127, 128, and 129 and the vertical dummy fins 124', 125', and 126', and a gate electrode layer 150 comprising a layer of conductive material disposed around and between the vertical semiconductor fins 121, 122, 123, 127, 128, and 129 and the vertical dummy fins 124', 125', and 126'. It is to be understood that the term "source/drain region" as used herein means that a given source/drain region can be either a source region or a drain region, depending on the application or circuit configuration.

The example embodiment of FIG. 1 shows a plurality of different regions including, for example, first and second device regions R1 and R2, and an isolation region R3 defined by the STI layer 110. The first device region R1 comprises at least one vertical FET device which comprises three vertical semiconductor fins 121, 122 and 123 commonly connected at one end to the lower source/drain region 104-1 and having separate upper source/drain regions 170-1 epitaxially grown on opposing ends of vertical semiconductor fins 121, 122 and 123. The vertical source/drain contact 190-1 is commonly connected to each of the upper source/drain regions 170-1. In this configuration, the three vertical semiconductor fins 121, 122, and 123 comprise three channel segments which are connected in parallel to collectively form a single, multi-fin vertical FET device in the first device region R1.

Similarly, the second device region R2 comprises at least one vertical FET device which comprises three vertical semiconductor fins 127, 128 and 129 commonly connected at one end to the lower source/drain region 104-2 and having separate upper source/drain regions 170-2 epitaxially grown on opposing ends of vertical semiconductor fins 127, 128 and 128. The vertical source/drain contact 190-2 is commonly connected to each of the upper source/drain regions 170-2. In this configuration, the three vertical semiconductor fins 127, 128 and 129 comprise three channel segments which are connected in parallel to collectively form a single, multi-fin vertical FET device in the second device region R2, thereby effectively providing separate conductive gate structures in the different device regions R1 and R2.

In the example embodiment of FIG. 1, the lower insulating spacer 130 serves to electrically insulate the lower source/drain regions 104-1 and 104-2 from the conductive gate structure 155, and the upper insulating spacer 160 serves to electrically insulate the upper source/drain regions 170-1 and 170-2 from the conductive gate structure 155. While the conductive gate structure 155 is commonly formed through the first and second device regions R1 and R2 and the isolation region, the vertical dummy fins 124', 125', and 126' are formed of an insulating material such as silicon nitride or other similar materials, which effectively insulates the portion of the conductive gate structure 155 in the first device region R1 from the portion of the conductive gate structure 155 in the second device region R2.

The vertical dummy fins 124', 125', and 126' are formed on the STI layer 110 in the isolation region R3 as part of a vertical FET fabrication process flow to enable the formation of vertical FET devices in the first and second device regions R1 and R2 with uniform structural profiles. Indeed, as explained in further detail below, the process flow for forming the vertical dummy fins 124', 125', and 126' serves to minimize or otherwise eliminate micro-loading effects from a dry etch process that is used to pattern the vertical semiconductor fins 121, 122, 123, 127, 128 and 129 of the vertical FET devices in the device regions R1 and R2. In addition, the process flow for forming the vertical dummy fins 124', 125', and 126' serves to minimize or otherwise eliminate non-uniform topography and micro-loading effects when planarizing and recessing a conductive gate layer to form the conductive gate structure 155, thereby enabling the formation of the conductive gate structure 155 with a uniform gate length (Lg) for the vertical FET devices across the first and second device regions R1 and R2.

Figure 2:
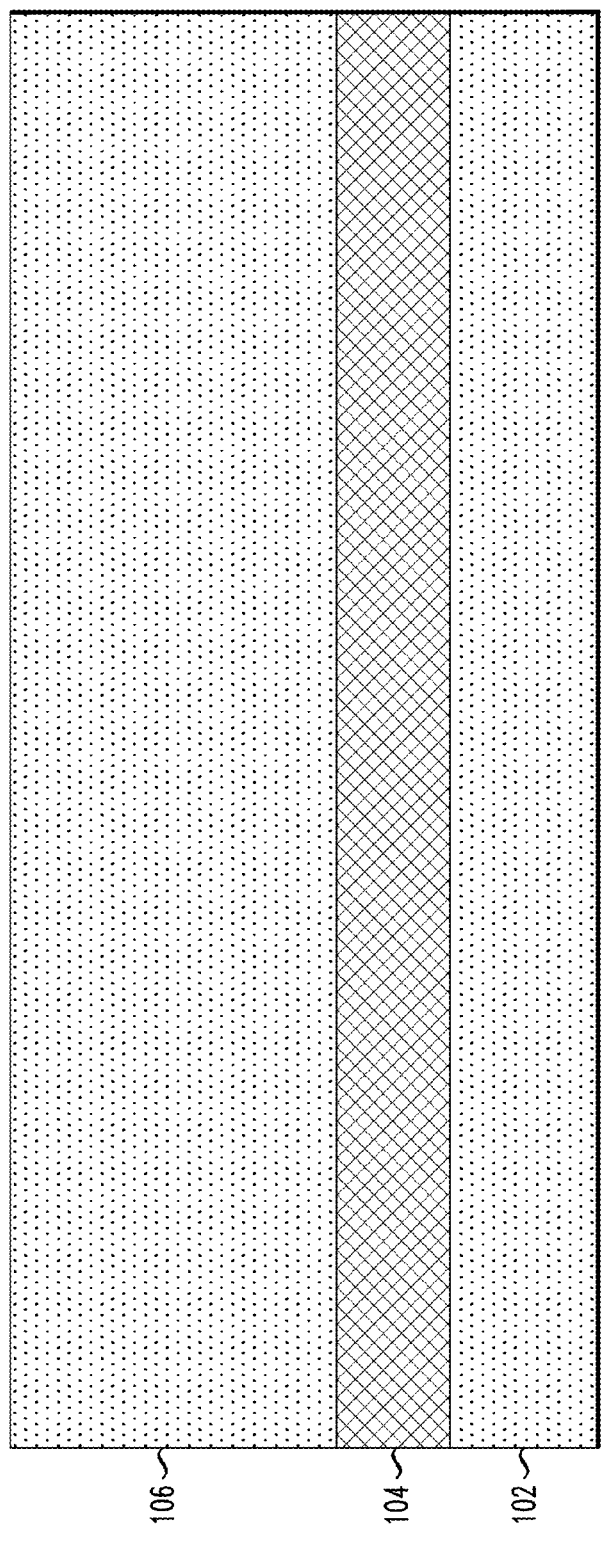

Methods for fabricating the semiconductor device 100 shown in FIG. 1 will now be discussed in further detail with reference to FIG. 2 through FIG. 18, which schematically illustrate the semiconductor device 100 at various stages of fabrication. To begin, FIG. 2 is a schematic cross-sectional side view of the semiconductor device 100 at an intermediate stage of fabrication in which a lower source/drain layer 104 and a monocrystalline semiconductor layer 106 are formed on the semiconductor substrate 102. While the semiconductor substrate 102 is generically illustrated in FIG. 2, the semiconductor substrate 102 may comprise one of different types of semiconductor substrate structures.

For example, in one embodiment, the semiconductor substrate 102 may comprise a bulk semiconductor substrate formed of, e.g., silicon, or other types of semiconductor substrate materials that are commonly used in bulk semiconductor fabrication processes such as germanium, silicon-germanium alloy, silicon carbide, silicon-germanium carbide alloy, or compound semiconductor materials (e.g. III-V and II-VI). Non-limiting examples of compound semiconductor materials include gallium arsenide, indium arsenide, and indium phosphide. In another embodiment, the semiconductor substrate 102 may comprise an active semiconductor layer (e.g., silicon layer, SiGe layer, III-V compound semiconductor layer, etc.) of a SOI (silicon on insulator) substrate, which comprises an insulating layer (e.g., oxide layer) disposed between a base substrate layer (e.g., silicon substrate) and the active semiconductor layer 102 in which active circuit components (e.g., vertical FET devices) are formed as part of a front-end-of-line (FEOL) layer.

The lower source/drain layer 104 and the monocrystalline semiconductor layer 106 are formed using known techniques and materials. For example, in one embodiment, the lower source/drain layer 104 comprises a doped epitaxial semiconductor layer that is epitaxially grown on a surface of the semiconductor substrate 102, and the monocrystalline semiconductor layer 106 comprises an epitaxial semiconductor layer that is epitaxially grown on a surface of the lower source/drain layer 104. In one embodiment, the monocrystalline semiconductor layer 106 is undoped. In another embodiment, the monocrystalline semiconductor layer 106 is lightly doped with doping concentration, for example, of less than $5 \times 10^{18}/cm^3$. As explained in further detail below, the lower source/drain layer 104 is subsequently patterned to form the lower source/drain regions 104-1 and 104-2 of the vertical FET devices shown in FIG. 1, and the undoped monocrystalline semiconductor layer 106 is subsequently patterned to form the vertical semiconductor fins 121, 122, 123, 127, 128 and 129 of the vertical FET devices shown in FIG. 1.

The type of epitaxial semiconductor material that is used to form the lower source/drain layer 104 will vary depending on various factors including, but not limited to, the type of semiconductor material used to grow the monocrystalline semiconductor layer 106 (lattice-matched semiconductor materials), the device type (e.g., n-type or p-type) of the vertical FET devices, etc. For example, for n-type vertical FET devices, the lower source/drain layer 104 may comprise a doped epitaxial silicon (Si) material, and for p-type vertical FET devices, the lower source/drain layer 104 may comprise a doped epitaxial silicon-germanium (SiGe) layer. Moreover, in one embodiment, the undoped monocrystalline semiconductor layer 106 may comprise an undoped single crystal Si layer. The lower source/drain layer 104 and the monocrystalline semiconductor layer 106 can be formed with other types of semiconductor materials (e.g., III-V compound semiconductor materials) which are commonly used to form source/drain regions and vertical semiconductor fins for vertical FET devices.

Furthermore, the lower source/drain layer 104 can be doped using known techniques. For example, in one embodiment, the lower source/drain layer 104 is in-situ doped wherein dopants are incorporated into the lower source/drain layer 104 during epitaxial growth of the lower source/drain layer 104 using a dopant gas such as, for example, a boron-containing gas such as $BH_3$ for pFETs or a phosphorus or arsenic containing gas such as $PH_3$ or $AsH_3$ for nFETs. In another embodiment, dopants can be incorporated in the lower source/drain layer 104 after the epitaxy process using doping techniques such as ion implantation.

In yet another embodiment, the lower source/drain layer 104 can be formed without epitaxy. For example, the lower source/drain layer 104 can be formed by adding dopants into a surface of the semiconductor substrate 102 (to a target depth which defines a thickness of the lower source/drain layer 104) using doping techniques such as ion implantation, gas phase doping, plasma doping, plasma immersion ion implantation, cluster doping, infusion doping, liquid phase doping, solid phase doping, etc. The monocrystalline semiconductor layer 106 is then epitaxially grown on the lower source/drain layer 104. The doping concentration in the lower source/drain layer 104 can be in a range from about $1 \times 10^{19}/cm^3$ to about $4 \times 10^{21}/cm^3$. In some embodiments, the lower source/drain layer 104 may comprise different materials in different device regions, e.g., a first material for n-type vertical FET devices, and another material for p-type vertical FET devices. Similarly, the monocrystalline semiconductor layer 106 may comprise different materials in different device regions, e.g., a first material for n-type vertical FET devices, and another material for p-type vertical FET devices.

In another embodiment of the invention, the lower source/drain layer 104 can be formed by ion implantation of dopants into the surface of the semiconductor substrate 102 to form a buried doped layer at a target level below the surface of the semiconductor substrate 102. For example, in this embodiment, the various layers 102, 104 and 106 may represent an upper surface of a undoped monocrystalline silicon substrate, wherein the lower source/drain layer 104 is formed by implanting dopants at a sufficient ion implantation energy to form the lower source/drain layer 104 at target depth below the surface of the semiconductor substrate layer (wherein a range of target depths define the initial thickness of the undoped monocrystalline layer 106). A thermal anneal process can be performed following the ion implantation process to recrystallize portions of the semiconductor substrate which may be partially damaged by the ion implantation, as is known in the art.

Figure 3:
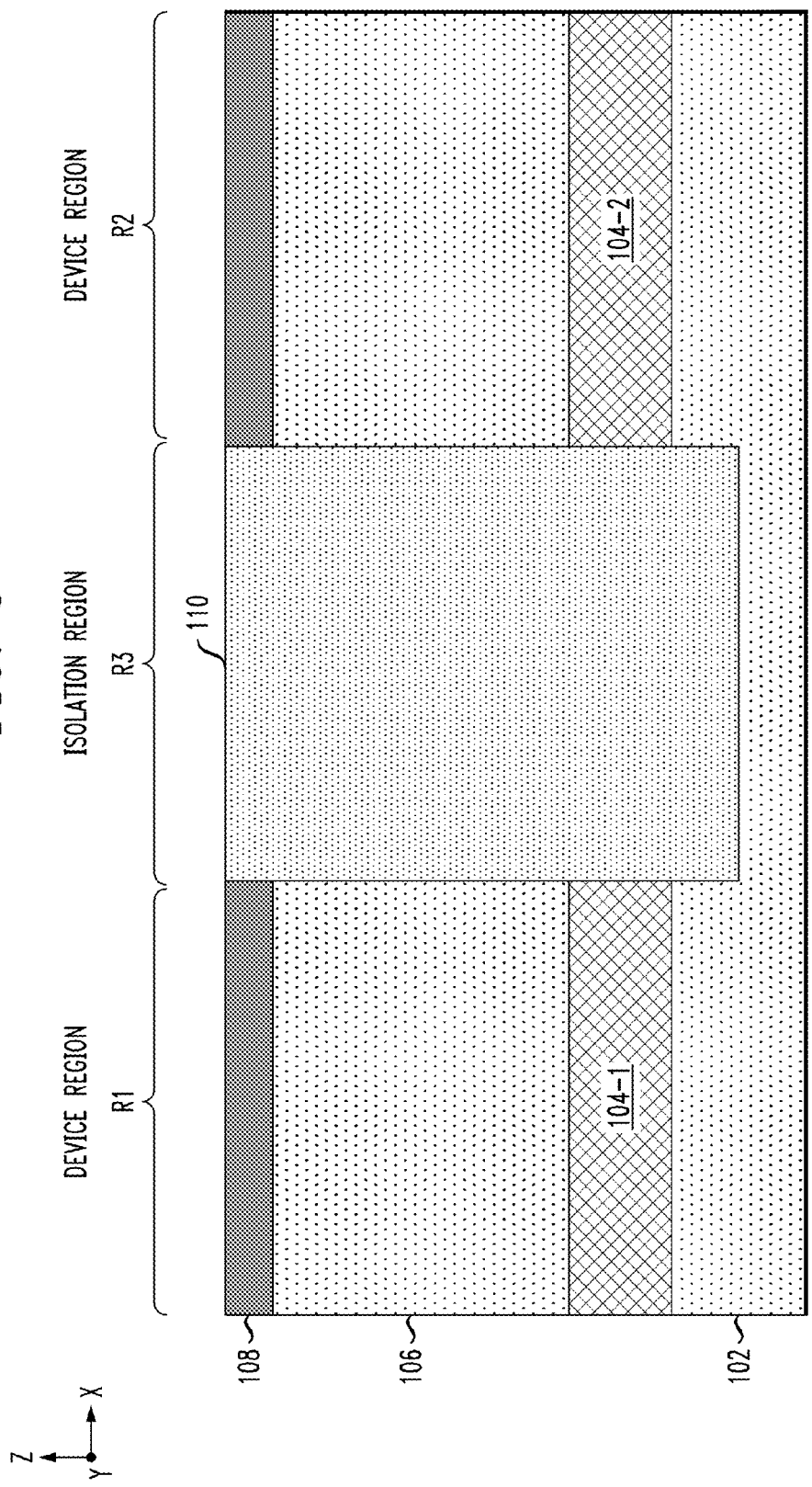
Figure 4:
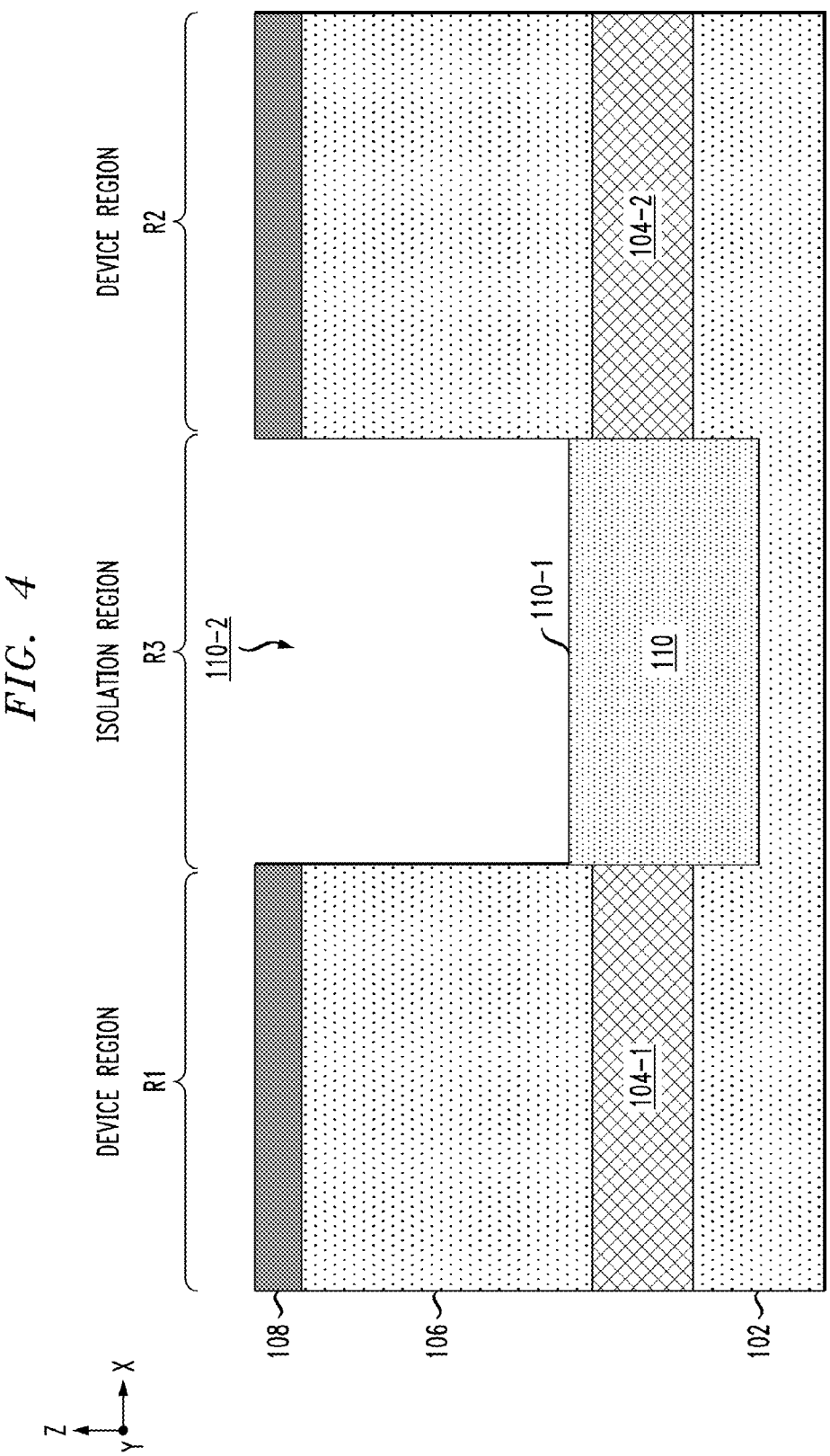

A next stage of the fabrication process comprises forming a STI structure in the isolation R3, using a process flow as schematically shown in FIGS. 3 and 4. In particular, FIG. 3 is a schematic cross-sectional side view of the semiconductor structure of FIG. 2 after forming a STI layer 110 which defines and isolates the active device regions R1 and R2. In one embodiment of the invention, the STI layer 110 is formed by a process which comprises depositing and patterning a pad nitride layer (e.g., silicon nitride layer) to form an etch hardmask 108 with an opening that defines an image of a shallow trench that is etched down through the layers 106 and 104 into the semiconductor substrate layer 102, depositing a layer of insulating material, such as silicon oxide, to fill the shallow trench, and then planarizing the overburden layer of insulating material down to the surface of the etch hardmask 108, to thereby form the STI layer 110 as shown in FIG. 3. The STI layer 110 extends into the substrate 102 below the lower source/drain layer 104, thereby patterning the lower source/drain layer 104 to form the separate lower source/drain regions 104-1 and 104-2 of the vertical FET devices in the device regions R1 and R2. In one embodiment, the STI layer 110 is formed by filling the shallow trench with one type of insulating material such as silicon oxide. In another embodiment, the STI layer 110 is formed with multiple insulating materials, e.g., forming a silicon nitride liner to line the shallow trench, and depositing a silicon oxide material over the liner to fill the shallow trench.

Next, FIG. 4 is a schematic cross-sectional side view of the semiconductor structure of FIG. 3 after recessing the STI layer 110 down to a lower region of the monocrystalline semiconductor layer 106. In one embodiment, the STI recess is performed using a dry etch process (e.g., RIE) to etch the STI layer 110 selective to the material of the etch hardmask 108. In one embodiment, the recess process is terminated using a timed etch process in which a recessed surface 110-1 of the STI layer 110 remains above the lower source/drain regions 104-1 and 104-2. The STI recess process results in the formation of a trench 110-2 above the recessed STI layer 110 in the isolation region R3.

Figure 5:
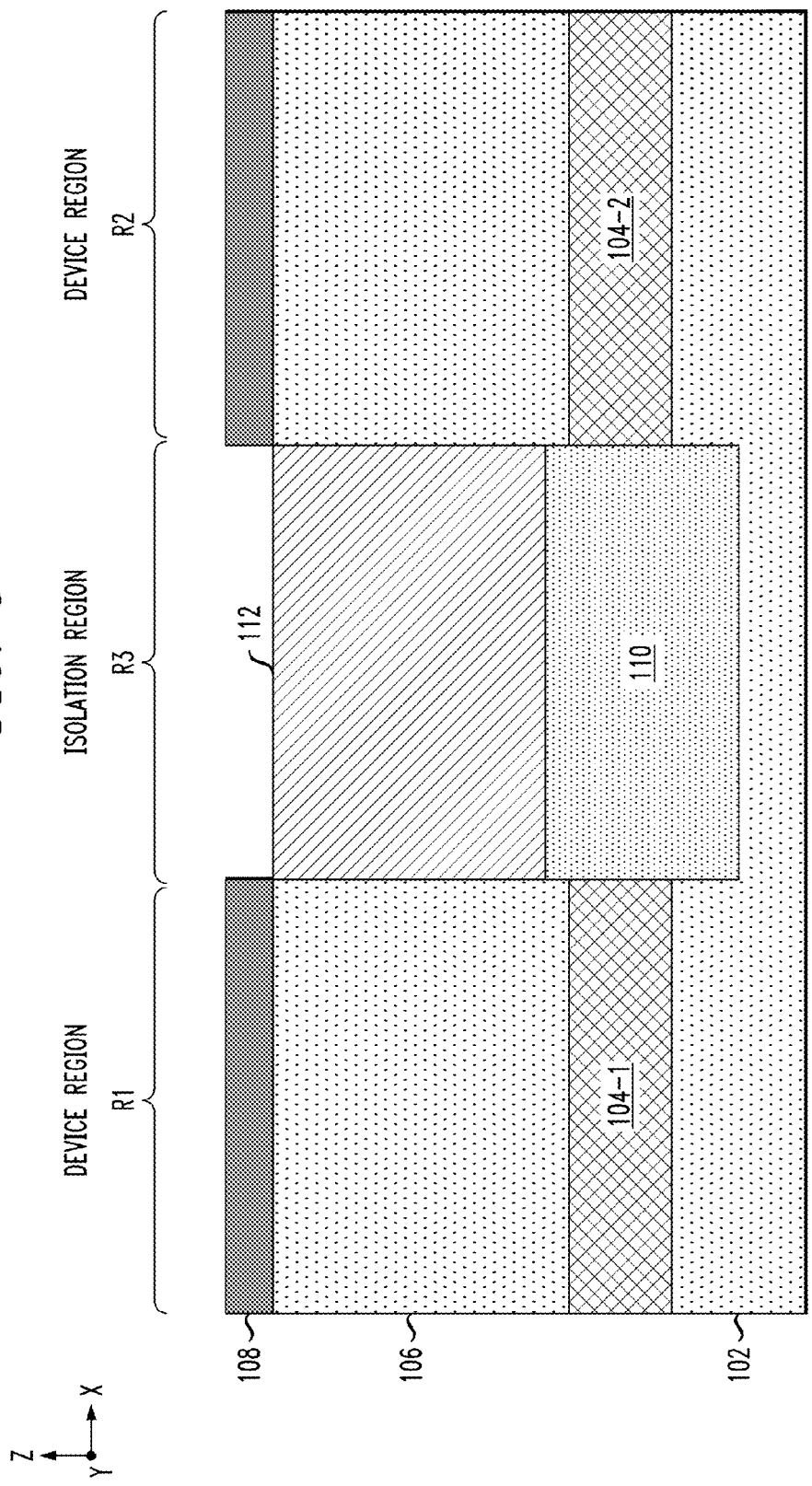
Figure 6:
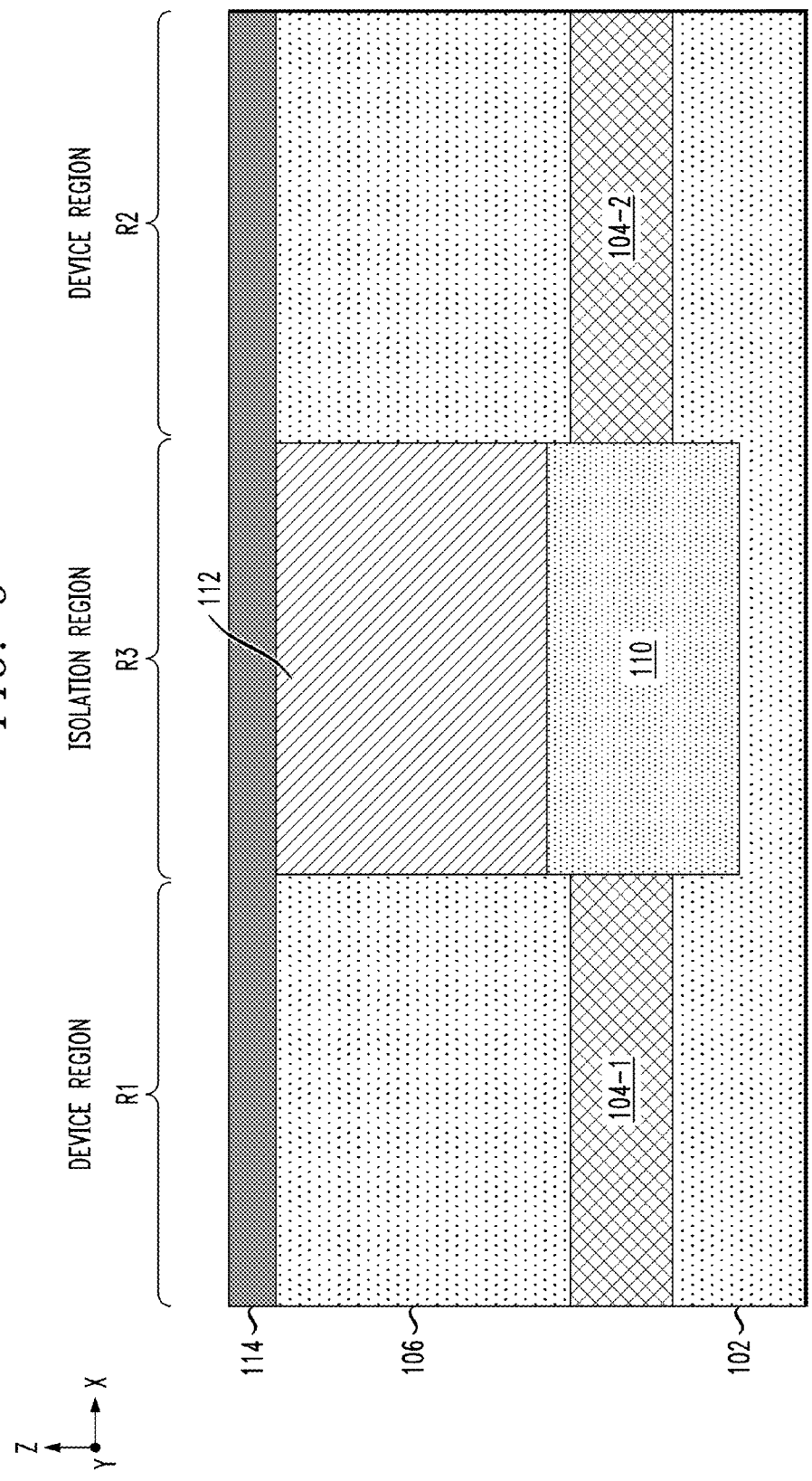
Figure 7:
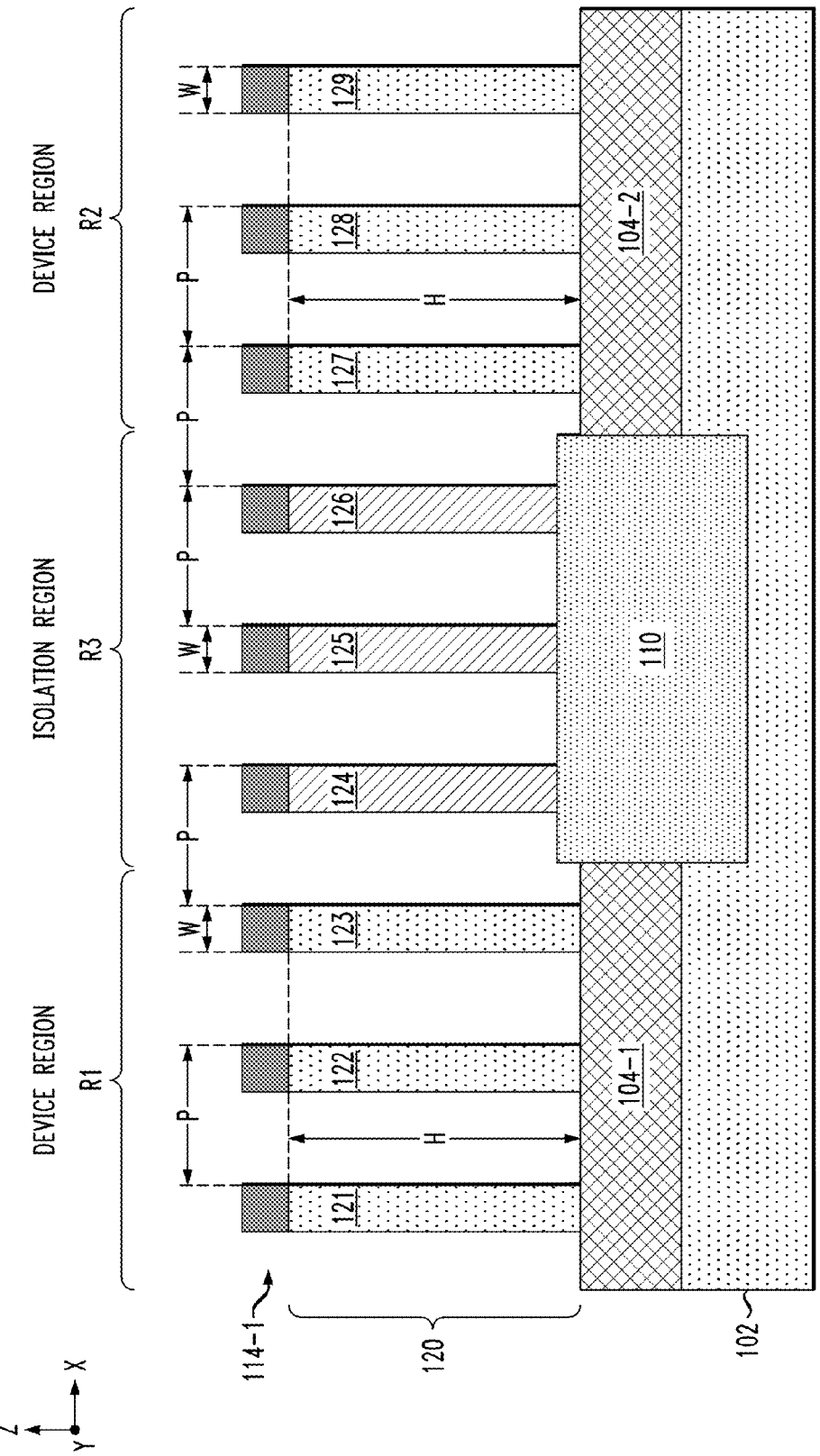

A next stage of the semiconductor fabrication process comprises filling the trench 110-2 with a sacrificial semiconductor material, and then patterning the sacrificial semiconductor material concurrently with the monocrystalline semiconductor layer 106 to form an array of vertical semiconductor fins across the device and isolation regions R1, R2, and R3, using a process flow as schematically illustrated in FIGS. 5, 6, and 7. In particular, FIG. 5 is a schematic cross-sectional side view of the semiconductor structure of FIG. 4 after forming a sacrificial semiconductor layer 112 on the recessed STI layer 110. In one embodiment, the sacrificial semiconductor layer 112 is formed by depositing a layer of semiconductor material to fill the trench 110-2 (FIG. 4), performing a planarization process (e.g., CMP) to remove the overburden semiconductor material down to the surface of the etch hardmask 108, and then performing an etch process to recess the sacrificial semiconductor layer 112 down to a level that is substantially level with an upper surface of the monocrystalline semiconductor layer 106, as shown in FIG. 5.

In one embodiment, the sacrificial semiconductor layer 112 is formed with a semiconductor material which has the same or similar dry etch properties (e.g., RIE etch properties) as the semiconductor material that forms the monocrystalline semiconductor layer 106, but which has different wet etch properties from the monocrystalline semiconductor layer 106. In another embodiment, the sacrificial semiconductor layer 112 is formed with a semiconductor material which has the same or similar dry etch properties (e.g. RIE etch properties) as the semiconductor material that forms the monocrystalline semiconductor layer 106 when a first dry etch chemistry is used, but which has different dry etch properties from the monocrystalline semiconductor layer 106 when a second dry etch chemistry is used, which is different from the first dry etch chemistry.

For example, when the monocrystalline semiconductor layer 106 is formed of single crystal Si, the sacrificial semiconductor layer 112 can be formed of amorphous Si, amorphous SiGe, polycrystalline Si, polycrystalline SiGe, etc. In addition, when the monocrystalline semiconductor layer 106 is formed of single crystal SiGe, the sacrificial semiconductor layer 112 can be formed of Si, amorphous SiGe, or polycrystalline SiGe, etc. By way of further example, when the monocrystalline semiconductor layer 106 is formed of a III-V compound semiconductor such as gallium arsenide (GaAs), the sacrificial semiconductor layer 112 can be formed gallium arsenide phosphide (GaAsP) or indium gallium arsenide indium (InGaAs). When the monocrystalline semiconductor layer 106 is formed of monocrystalline Si, and the sacrificial semiconductor layer 112 is formed of amorphous or polycrystalline Si or SiGe, the different layers 106 and 112 can have the same or similar dry etch properties via RIE, while a gas phase etch containing HCl (hydrochloride or hydrochloric acid) can be used to etch the material of the sacrificial semiconductor layer 112 selective to the material of the monocrystalline semiconductor layer 106.

Next, FIG. 6 is a schematic cross-sectional side view of the semiconductor structure of FIG. 5 after forming a hardmask layer 114 on the surface of the semiconductor structure. In one embodiment, the semiconductor structure shown in FIG. 6 is formed by stripping away the etch hardmask 108 (FIG. 5), and then depositing a layer of dielectric material, such as silicon nitride (SiN), to cover the upper surfaces of the monocrystalline and sacrificial semiconductor layers 106 and 112. A next step in the illustrative fabrication process comprises patterning the hardmask layer 114 to form an etch hardmask that is used to etch a pattern of vertical fin structures in the device regions R1 and R2 and the isolation region R3.

For example, FIG. 7 is a schematic cross-sectional side view of the semiconductor structure of FIG. 6 after patterning the hardmask layer 114 to form an etch hardmask 114-1, and patterning the monocrystalline semiconductor layer 106 and the sacrificial semiconductor layer 112 using the image of the etch hardmask 114-1 to form an array of vertical fin structures 120 throughout the regions R1, R2, and R3. More specifically, in the illustrative embodiment shown in FIG. 7, the array of vertical fin structures 120 comprises vertical semiconductor fins 121, 122, and 123 in the first device region R1, sacrificial vertical semiconductor fins 124, 125, and 126 in the isolation region R3, and vertical semiconductor fins 127, 128, and 129 in the second device region R2. The etch hardmask 114-1 is formed by patterning the hardmask layer 114 (FIG. 6) using known techniques including, but not limited to, standard photolithography techniques or sidewall image transfer (SIT) techniques, etc. A directional dry etch process (e.g., RIE) is then performed using the etch hardmask 114-1 to etch exposed portions of the monocrystalline semiconductor layer 106 down to the lower source/drain regions 104-1 and 104-2, and to etch exposed portions of the sacrificial semiconductor layer 112 down to the recessed STI layer 110, thereby forming the array of vertical fins 120 over the regions R1, R2, and R3.

In the example embodiment of FIG. 7, the exposed portions of the monocrystalline semiconductor layer 106 in the active device regions R1 and R2 and the exposed portions of the sacrificial semiconductor layer 112 in the isolation region R3 are anisotropically etched using a dry etch plasma process (e.g., RIE) with an etch chemistry that is suitable to etch the semiconductor materials of the monocrystalline semiconductor layer 106 and the sacrificial semiconductor layer 112 selective to the materials of the etch hardmask 114-1, the source/drain regions 104-1, 104-2, and the STI layer 110. As noted above, the semiconductor materials that are used to form the monocrystalline semiconductor layer 106 and the sacrificial semiconductor layer 112 have the same or substantially the same dry etch properties to eliminate or substantially reduce micro-loading effects during the dry etch process.

In particular, since the monocrystalline semiconductor layer 106 and the sacrificial semiconductor layer 112 are formed with semiconductor materials that have the same or substantially the same dry etch properties, the concurrent patterning of the sacrificial semiconductor layer 112 to form the sacrificial vertical semiconductor fins 124, 125, and 126 in the isolation region R3 serves to reduce or eliminate the micro-loading effects that the dry etch process would have on the formation of the vertical semiconductor fins 121, 122, 123, 127, 128 and 129 in the active device regions R1 and R2, thus enabling the formation of the vertical semiconductor fins 121, 122, 123, 127, 128 and 129 with uniform structural profiles. For example, if the sacrificial vertical semiconductor fins 124, 125, and 126 were not concurrently formed in the isolation region R3 during the dry etch process, then the vertical semiconductor fins 123 and 127 adjacent to the isolation region R3 would have non-uniform structural profiles (e.g., different sidewall profiles) due to the different micro-etch chemistries that would exist in the active device and isolation regions adjacent to the opposing sidewalls of the semiconductor fins 123 and 127. However, the concurrent patterning of the array of vertical fins 120 across the device and isolation regions R1, R2, and R3 enables the formation of the vertical semiconductor fins 121, 122, 123, 127, 128 and 129 with uniform structural profiles across the active device regions R1 and R2, which is desired.

As shown in FIG. 7, in one embodiment, the vertical semiconductor fins 121, 122, 123, 127, 128 and 129 in the active device regions R1 and R2, and the sacrificial vertical semiconductor fins 124, 125, and 126 in the isolation region R3, are patterned to have the same width (W) and pitch (P)

throughout the regions R1, R2, and R3, as well as the same length (not shown) in the Y-direction. In addition, the vertical semiconductor fins 121, 122, 123, 127, 128 and 129 in the active device regions R1 and R2 are formed with a height H, which is defined by the thickness of the monocrystalline semiconductor layer 106. In one example embodiment, the width W of the vertical fins 120 is in a range of about 5 nm to about 20 nm, the length of the vertical fins 120 is in a range of about 50 nm to about 1000 nm, and the pitch P of the vertical fins 120 is in a range of about 20 nm to about 100 nm. Further, the height H of the vertical semiconductor fins 121, 122, 123, 127, 128 and 129 in the active device regions R1 and R2 is in a range of about 30 nm to about 100 nm. The formation of the sacrificial vertical semiconductor fins 124, 125, and 126 in the isolation region R3 with the same with W and pitch P1 as the vertical semiconductor fins 121, 122, 123, 127, 128 and 129 in the active device regions R1 and R2 serves to reduce or eliminate the micro-loading effects of the dry etch process.

Figure 8:
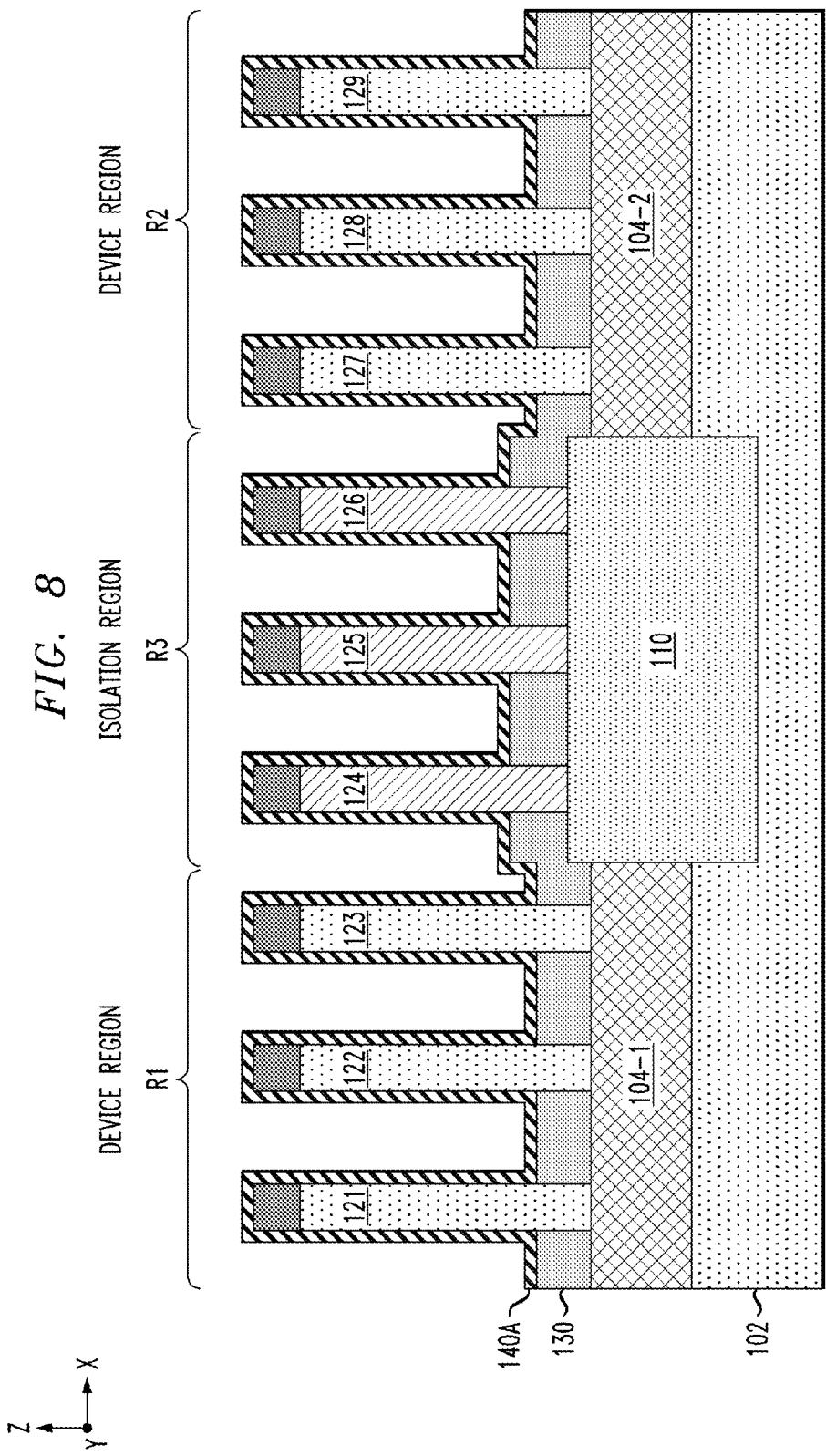

A next phase of the semiconductor fabrication process comprises forming the conductive gate structure 155 (e.g., metal gate structure) and the lower and upper insulating spacers 130 and 160 (as shown in FIG. 1), using a process flow as schematically illustrated in FIGS. 8-12. In particular, FIG. 8 is a schematic cross-sectional side view of the semiconductor structure of FIG. 7 after forming the lower insulating spacer 130 and depositing a conformal layer of gate dielectric material 140A. In one embodiment, the lower insulating spacer 130 layer is formed by depositing a layer of low-k dielectric material such as $SiO_2$, SiN, SiBCN or SiOCN, or some other type of dielectric material that is commonly used to form insulating spacers for vertical FET devices. In addition, the lower insulating spacer 130 may be formed using a directional deposition process in which the dielectric/insulating material is directly deposited on lateral surfaces, or by blanket depositing the dielectric/insulating material followed by planarizing and recessing the dielectric/insulating material, using well-known deposition and etching techniques.

Further, in one embodiment, the conformal layer of gate dielectric material is formed by depositing one or more conformal layers of gate dielectric material over the surface of the semiconductor structure. The gate dielectric material may comprise, e.g., nitride, oxynitride, or oxide or a high-k dielectric material having a dielectric constant of about 3.9 or greater. In particular, the conformal layer of gate dielectric material 140A can include silicon oxide, silicon nitride, silicon oxynitride, boron nitride, high-k materials, or any combination of these materials. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k gate dielectric material may further include dopants such as lanthanum, aluminum. In one embodiment of the invention, the conformal layer of gate dielectric material is formed with a thickness in a range of about 0.5 nm to about 2.5 nm, which will vary depending on the target application. The conformal layer of gate dielectric material 140A is deposited using known methods such as atomic layer deposition (ALD), for example, which allows for high conformality of the gate dielectric material.

Figure 9:
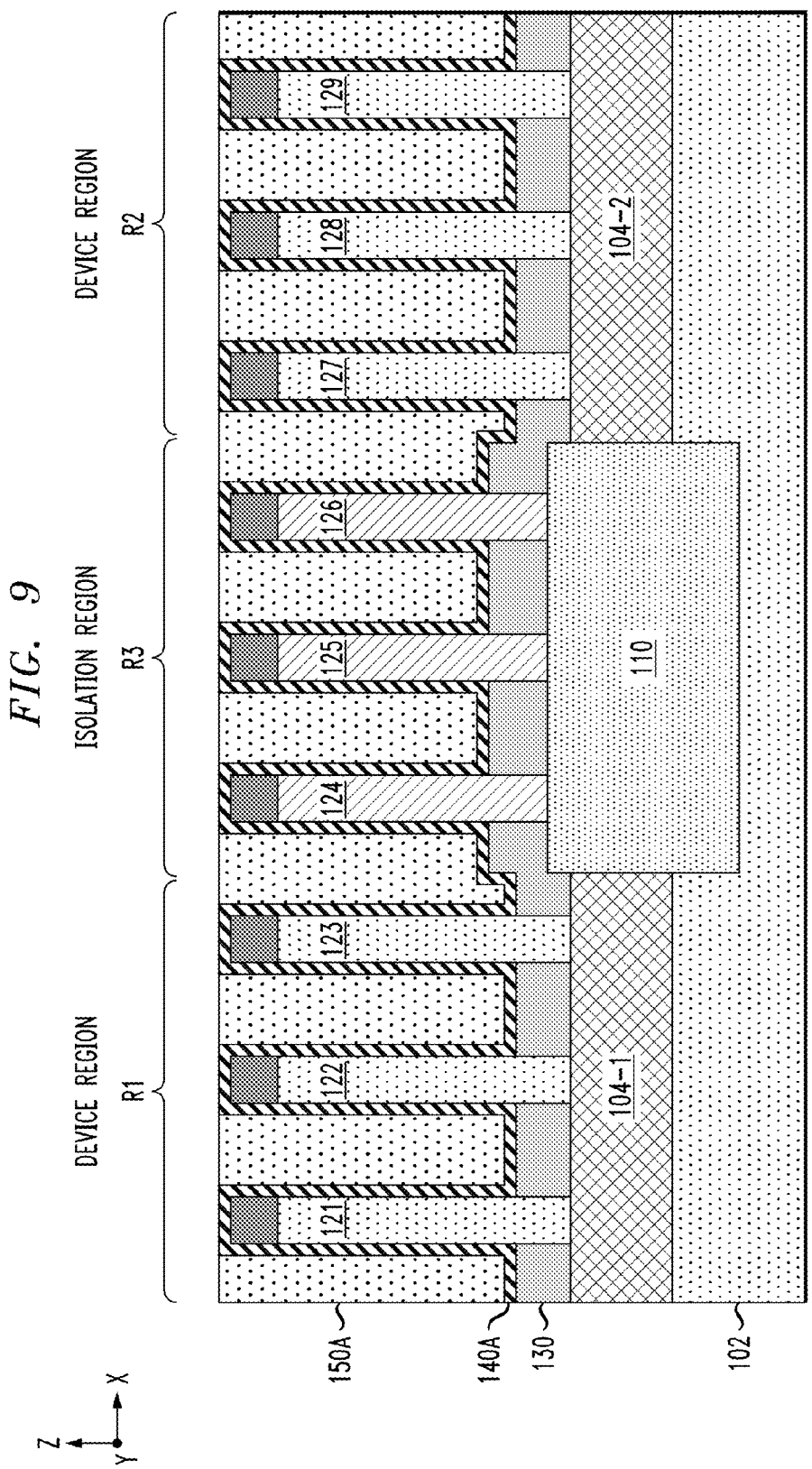

Next, FIG. 9 is a schematic cross-sectional side view of the semiconductor structure of FIG. 8 after depositing and planarizing a layer of conductive material 150A which is used to form the gate electrode layer 150 (FIG. 1). The layer of conductive material 150A is formed by depositing a conductive material including, but not limited to, doped polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of such conductive materials. The layer of conductive material 150A may further comprise dopants that are incorporated during or after deposition. The layer of conductive material 150A is deposited using a suitable deposition process, for example, CVD, PECVD, PVD, plating, thermal or e-beam evaporation, sputtering, etc.

In another embodiment, a thin conformal layer of work function metal (WFM) may be deposited over the conformal layer of gate dielectric material 140A prior to depositing the layer of conductive material 150A. The thin conformal WFM layer can be formed of one or more types of metallic materials, including, but not limited to, TiN, TaN, TiAlC, Zr, W, Hf, Ti, Al, Ru, Pa, TiAl, ZrAl, WAl, TaAl, HfAl, TiAlC, TaC, TiC, TaMgC, or other work function metals or alloys that are commonly used to obtain target work functions which are suitable for the type (e.g., n-type or p-type) of vertical FET devices that are to be formed. The conformal WFM layer is deposited using known methods such as ALD, CVD, etc. In one embodiment, the conformal WFM layer is formed with a thickness in a range of about 2 nm to about 5 nm. In another embodiment, the conductive material 150A that forms the gate electrode layer 150 can serve as a WFM layer.

Figure 10:
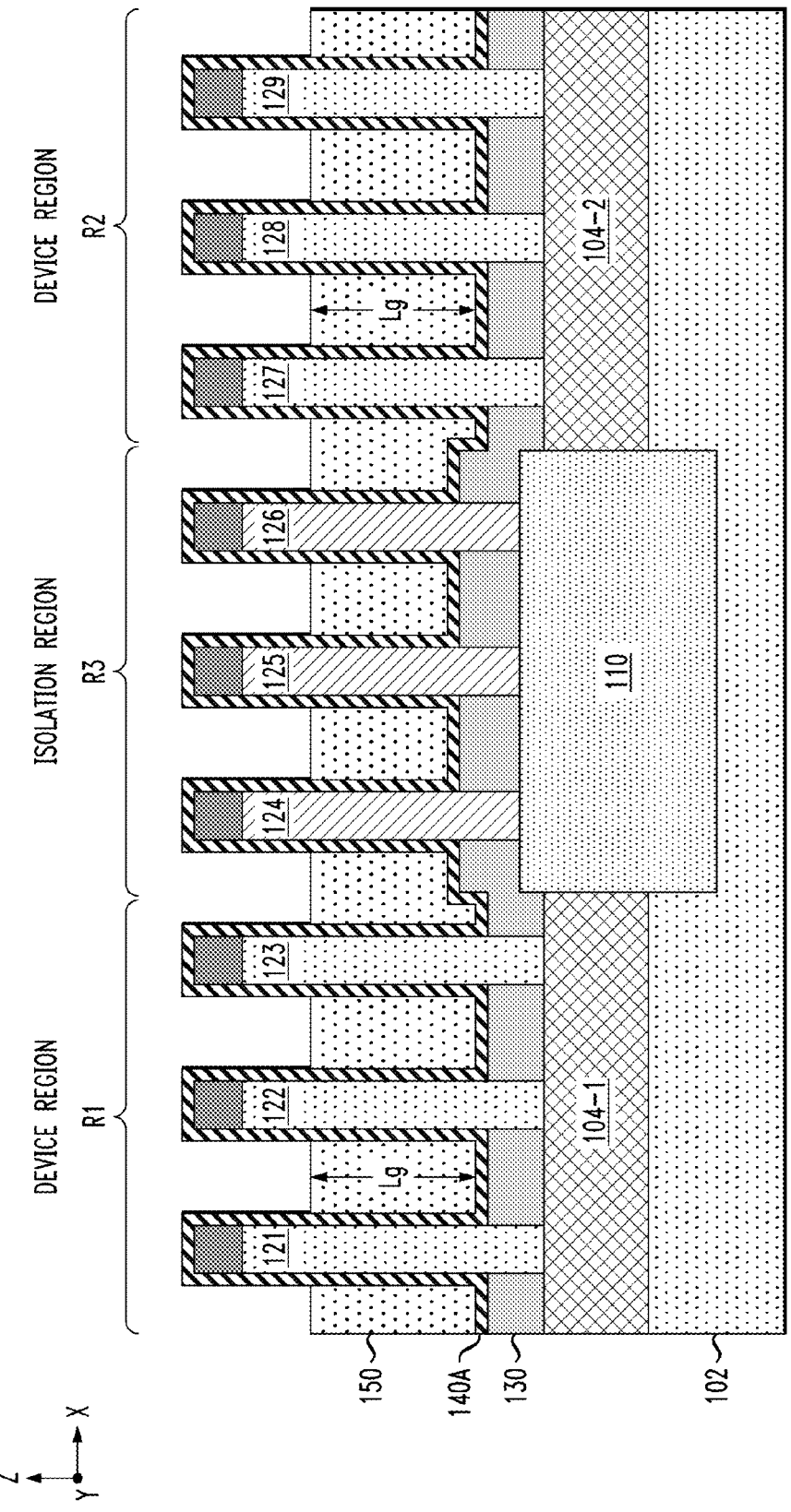

Following the deposition of the layer of conductive material 150A, a planarization process (e.g., CMP) is performed to polish the surface of the semiconductor structure down to the conformal layer of gate dielectric material 140A, thereby removing the overburden portion of the layer of conductive material 150A, resulting in the semiconductor structure shown in FIG. 9. Following the planarizing process, the layer of conductive material 150A is recessed down to form the gate electrode layer 150. In particular, FIG. 10 is a schematic cross-sectional side view of the semiconductor structure of FIG. 9 after recessing the layer of conductive material 150A to form the gate electrode layer 150 with a recessed thickness that defines the gate length (Lg) of the vertical FET devices to be formed in the active device regions R1 and R2. The gate recess can be performed using well known etch-back/recess techniques in which a timed etch process is performed to etch the layer of conductive material 150A down to a target recess level to form the gate electrode layer 150.

During the CMP process, the presence of the sacrificial vertical semiconductor fins 124, 125, and 126 in the isolation region R3 serves to prevent over polishing of the layer of conductive material 150A (e.g., CPM dishing/erosion) in the isolation region R3, which would typically occur in the isolation region R3 as a result of the CMP process without the presence of the sacrificial vertical semiconductor fins 124, 125, and 126. By preventing CMP dishing/erosion of layer of conductive material 150A in the isolation region R3, a more uniform recess is achieved when recessing the layer of conductive material 150A down to the target level (via the timed etch process) to define the gate length Lg.

For example, without the sacrificial vertical semiconductor fins 124, 125, and 126 in the isolation region R3, the initial thickness of the conductive material 150A on the sidewalls of the vertical semiconductor fins 123 and 127 adjacent the isolation region R3 may be less than the thickness of the conductive material 150A on the opposing sidewalls of the vertical semiconductor fins 123 and 127 adjacent to the device regions R1 and R2. As a result of this initial non-uniform thickness, the gate recess process would result in non-uniform gate lengths Lg of the resulting gate electrode layer 150 on the opposing sides of the vertical semiconductor fins 123 and 127. In short, the presence of the sacrificial vertical semiconductor fins 124, 125, and 126 in the isolation region R3 ensures that all vertical semiconductor fins in the active device regions R1 and R2 have the same patterning environment, thus resulting in a uniform gate recess (i.e., uniform Lg) in the active device regions R1 and R2.

Figure 11:
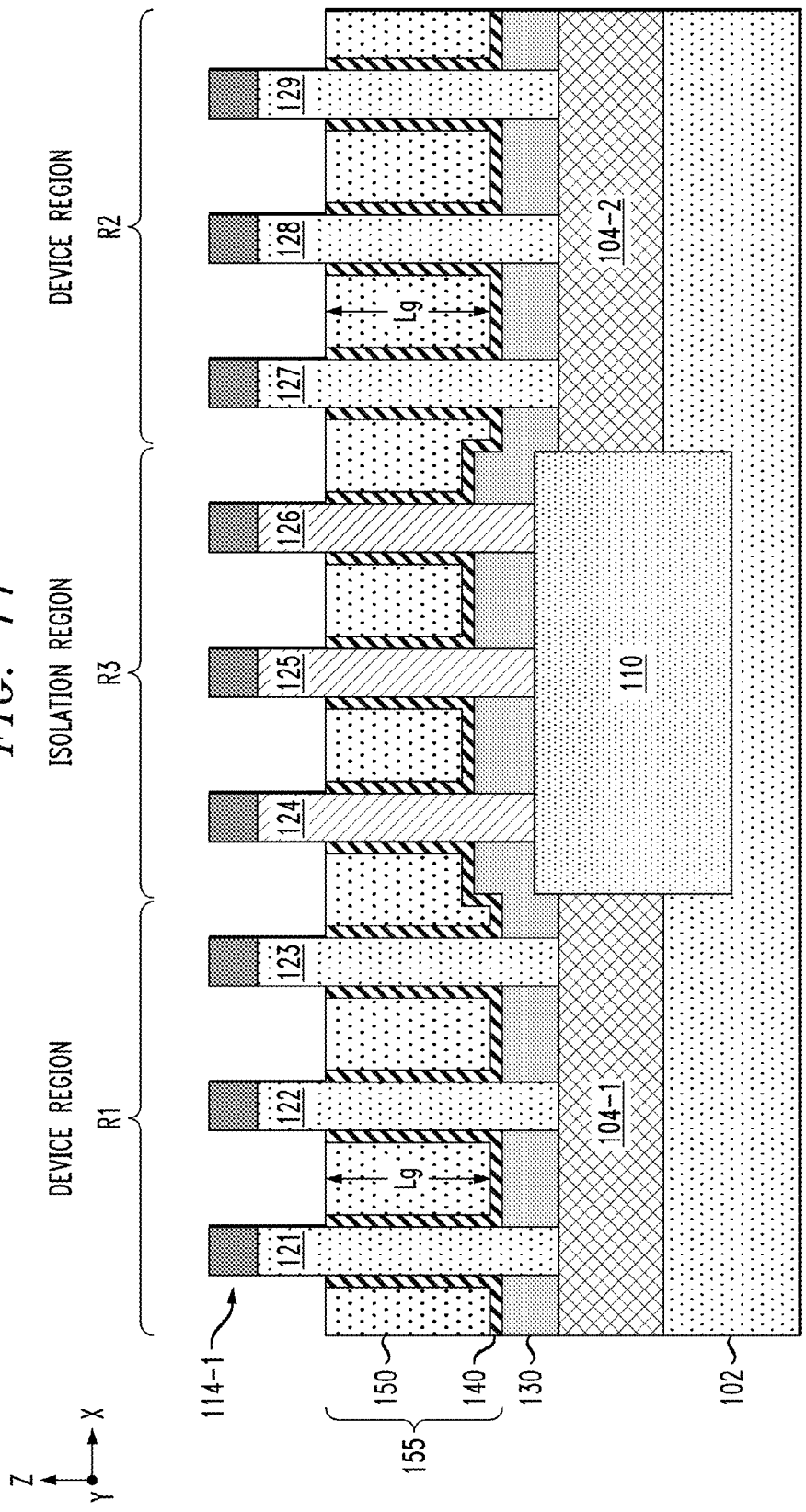

Next, FIG. 11 is a schematic cross-sectional side view of the semiconductor structure of FIG. 10 after removing exposed portions of the gate dielectric layer 140A on upper portions of the vertical fins 121~129 in the active device and isolation regions R1, R2, and R3, thereby forming the conductive gate structure 155 for the vertical FET devices in the active device regions R1 and R2. The exposed portions of the gate dielectric layer 140A are etched using a dry or wet etch process which is selective to the materials of the vertical fins 120, the gate electrode layer 150, and the etch hardmask 114-1. As noted above, the portions of the conductive gate structure 155 in the first and second active device regions R1 and R2 are electrically isolated by the insulting dummy fin structures 124', 125', and 126' that are subsequently formed to replace the sacrificial vertical semiconductor fins 1124, 125, and 126 in the isolation region R3. In another embodiment, the exposed portions of the gate dielectric layer 140A on the upper portion of the vertical fins 120 are not removed (i.e., etching away the exposed portions of the gate dielectric 140A is optional).

Figure 12:
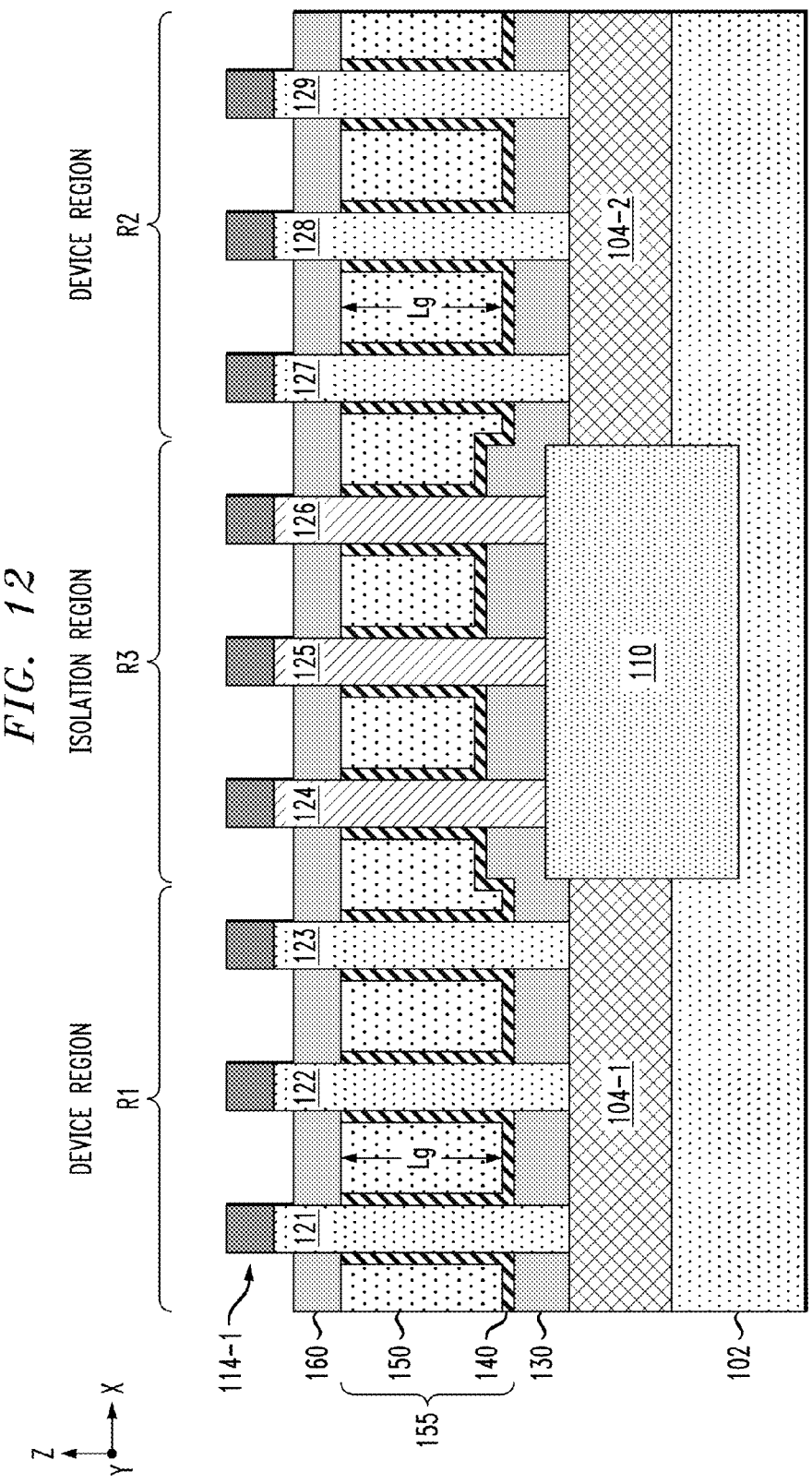

Next, FIG. 12 is a schematic cross-sectional side view of the semiconductor structure of FIG. 11 after forming the upper insulating spacer 160 on the upper surface of the conductive gate structure 155. In one embodiment, the upper insulating spacer 160 is formed of the same or similar low-k dielectric materials and using the same or similar deposition techniques as discussed above with regard to the lower insulating spacer 130. Other suitable techniques can also be used to form the upper insulating spacer 160.

Figure 13:
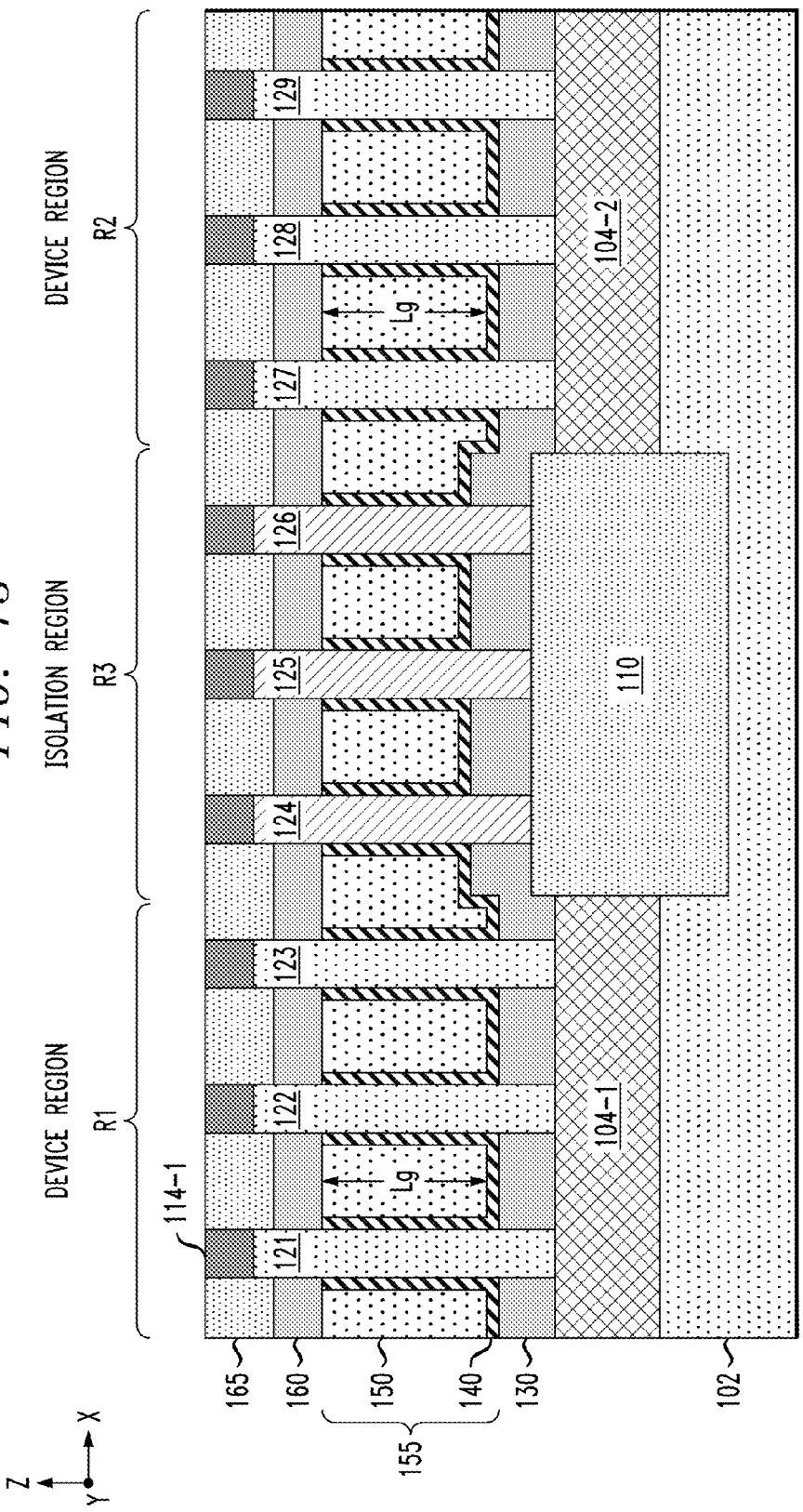
Figure 14:
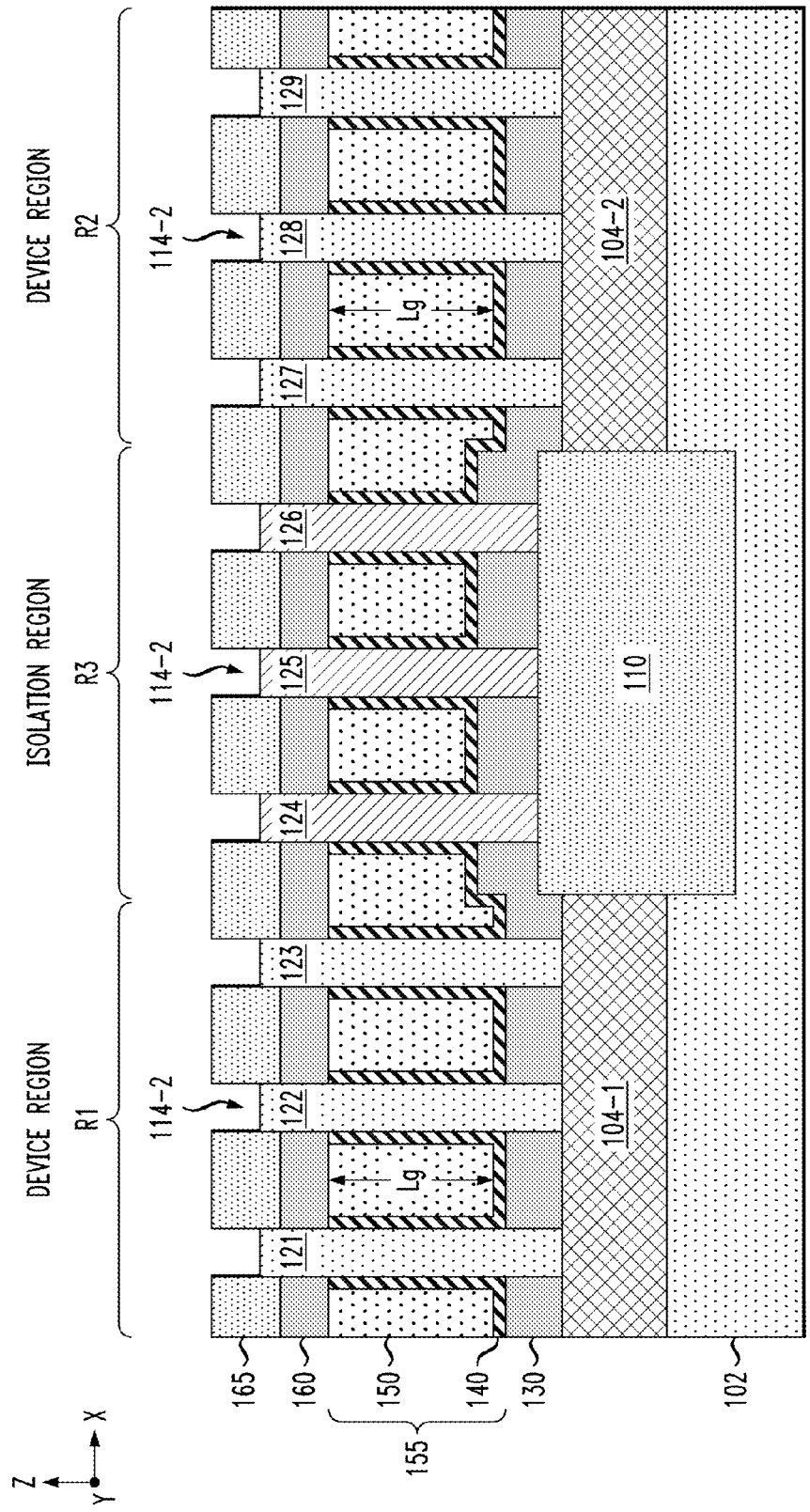

A next phase of the semiconductor fabrication process comprises replacing the sacrificial vertical semiconductor fins 124, 125, and 126 with insulating material to form the vertical dummy fin structures 124', 125' and 126' in the isolation region R3, using a process flow as schematically illustrated in FIGS. 13~17. In particular, FIG. 13 is a schematic cross-sectional side view of the semiconductor structure of FIG. 12 after depositing a layer of insulating material 165 (e.g., silicon oxide) on the surface of the semiconductor structure and removing the overburden insulating material by planarizing (e.g., CMP) the surface of the semiconductor structure down to the etch hardmask 114-1 on top of the vertical fins 120 in the active device and isolation regions R1, R2, and R3. The layer of insulating material 165 is formed of a material that has etch selectivity relative to the material of the etch hardmask 114-1, which enables selective removal of the etch hardmask 114-1 as shown in FIG. 14.

In particular, FIG. 14 is a schematic cross-sectional side view of the semiconductor structure of FIG. 13 after removing the etch hardmask 114-1 to form shallow trenches 114-2 which expose the upper surfaces of the vertical fins 120 in the active device and isolation regions R1, R2, and R3. The etch hardmask 114-1 can be removed using a dry or wet etch process having an etch chemistry that is configured to etch away the material of the etch hardmask 114-1 selective to the materials of the insulating layer 165 and the vertical fins 120.

Figure 15:
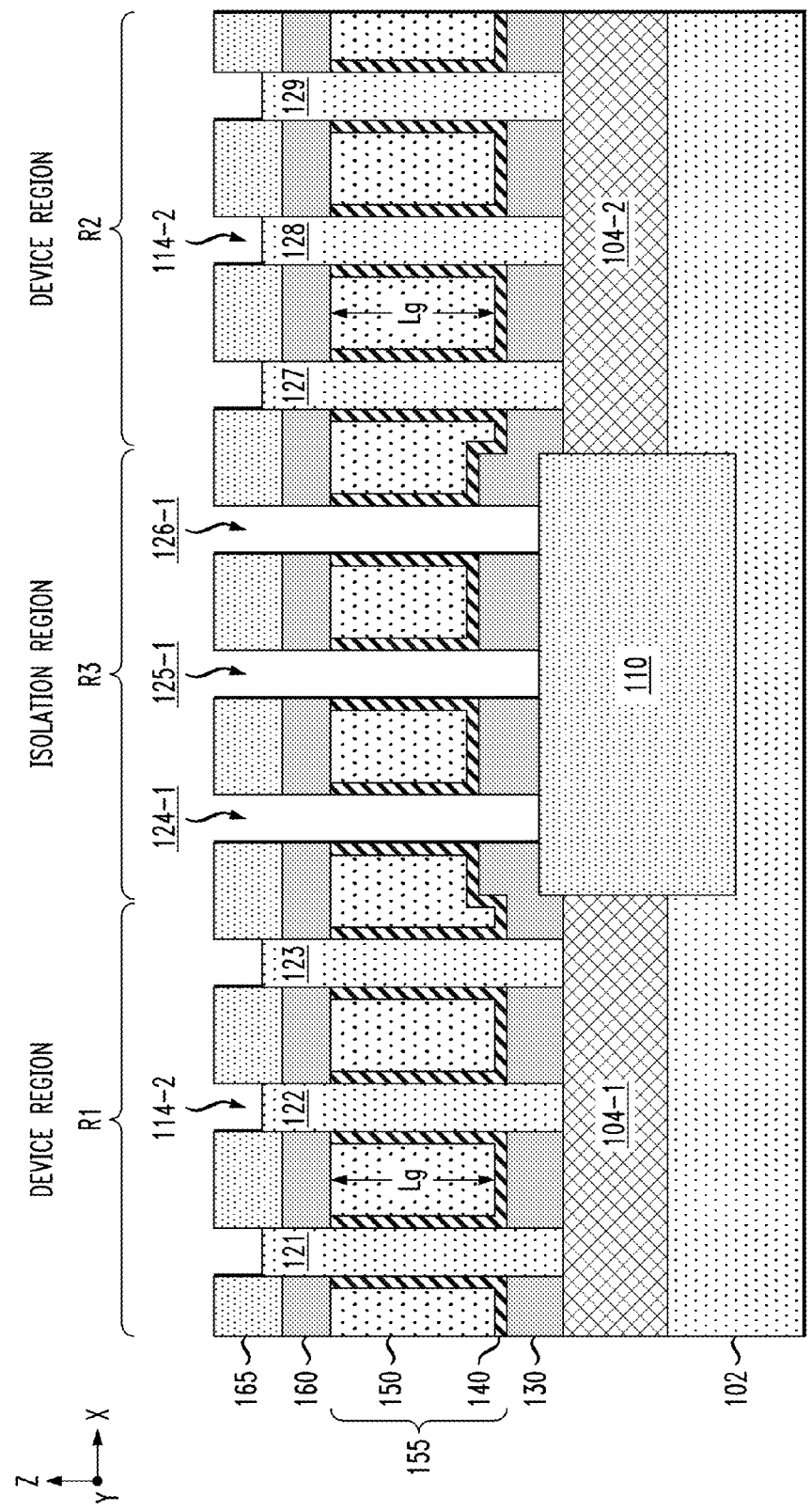

Next, FIG. 15 is a schematic cross-sectional side view of the semiconductor structure of FIG. 14 after removing the sacrificial vertical semiconductor fins 124, 125, and 126 in the isolation region R3 to form trenches 124-1, 125-1, and 126-1, respectively, down to the STI layer 110. In one embodiment of the invention, the sacrificial vertical semiconductor fins 124, 125, and 126 are removed using a wet etch process (or other suitable etch process) that is selective to the semiconductor material which forms the vertical semiconductor fins 121, 122, 123, 127, 128 and 129 in the active device regions R1 and R2. In this manner, the sacrificial vertical semiconductor fins 124, 125, and 126 in the isolation region R3 can be removed without etching or damaging the vertical semiconductor fins 121, 122, 123, 127, 128 and 129 in the active device regions R1 and R2.

For example, in one embodiment of the invention, a wet solution containing ammonia ($NH_4OH$) and hydrogen peroxide ($H_2O_2$) can be used to etch away the sacrificial vertical semiconductor fins 124, 125, and 126 in the isolation region R3 selective to the vertical semiconductor fins 121, 122, 123, 127, 128 and 129 in the active device regions R1 and R2. In another embodiment, as noted above, a gas phase HCl (hydrochloric acid) can be used to etch away the sacrificial vertical semiconductor fins 124, 125, and 126 in the isolation region R3 highly selective to the vertical semiconductor fins 121, 122, 123, 127, 128 and 129 in the active device regions R1 and R2 when, for example, the vertical semiconductor fins 121, 122, 123, 127, 128, and 129 are formed of monocrystalline Si, and the sacrificial vertical semiconductor fins 124, 125, and 126 are formed of amorphous SiGe or polycrystalline SiGe.

Figure 16:
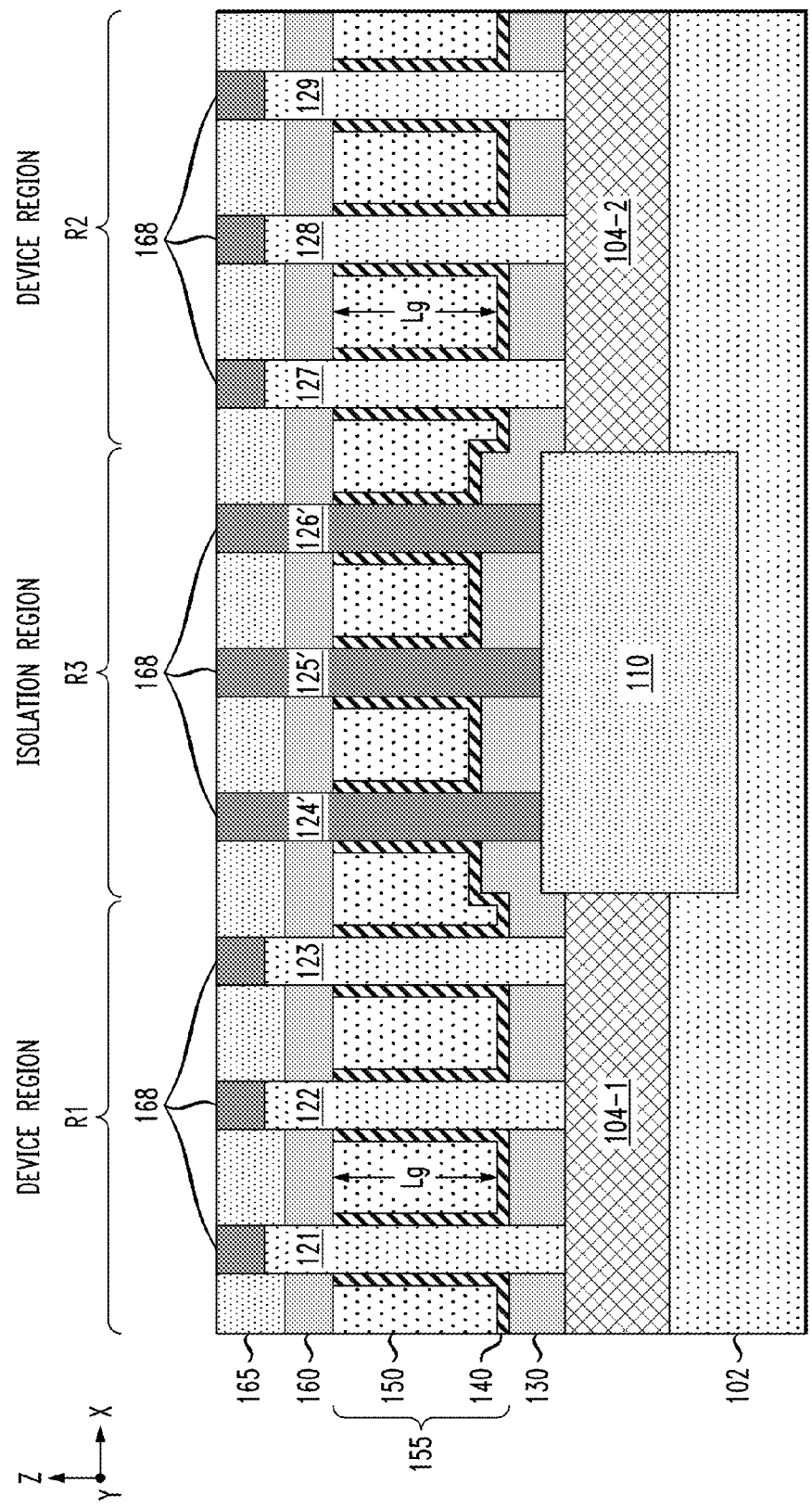

A next step in the fabrication process is shown in FIG. 16, which is a schematic cross-sectional side view of the semiconductor structure of FIG. 15 after filling the trenches 114-2, 124-1, 125-1, and 126-1 with an insulating material 168 to form the vertical dummy fins 124', 125', and 126' in the isolation region R3. In one embodiment of the invention, the vertical dummy fins 124', 125', and 126' are formed by depositing a layer of insulating material, such as silicon nitride, silicon oxide, SiBCN, SiCO, SiOCN, or any suitable combination of those materials, to fill the trenches, and then planarizing the surface of the semiconductor structure to remove the overburden insulating material down to the insulating layer 165, resulting in the semiconductor structure shown in FIG. 16. By forming the vertical dummy fins 124', 125', and 126' with an insulating material, the portions of the conductive gate structure 155 in the adjacent active device regions R1 and R2 are effectively electrically isolated/insulated from each other.

Figure 17:
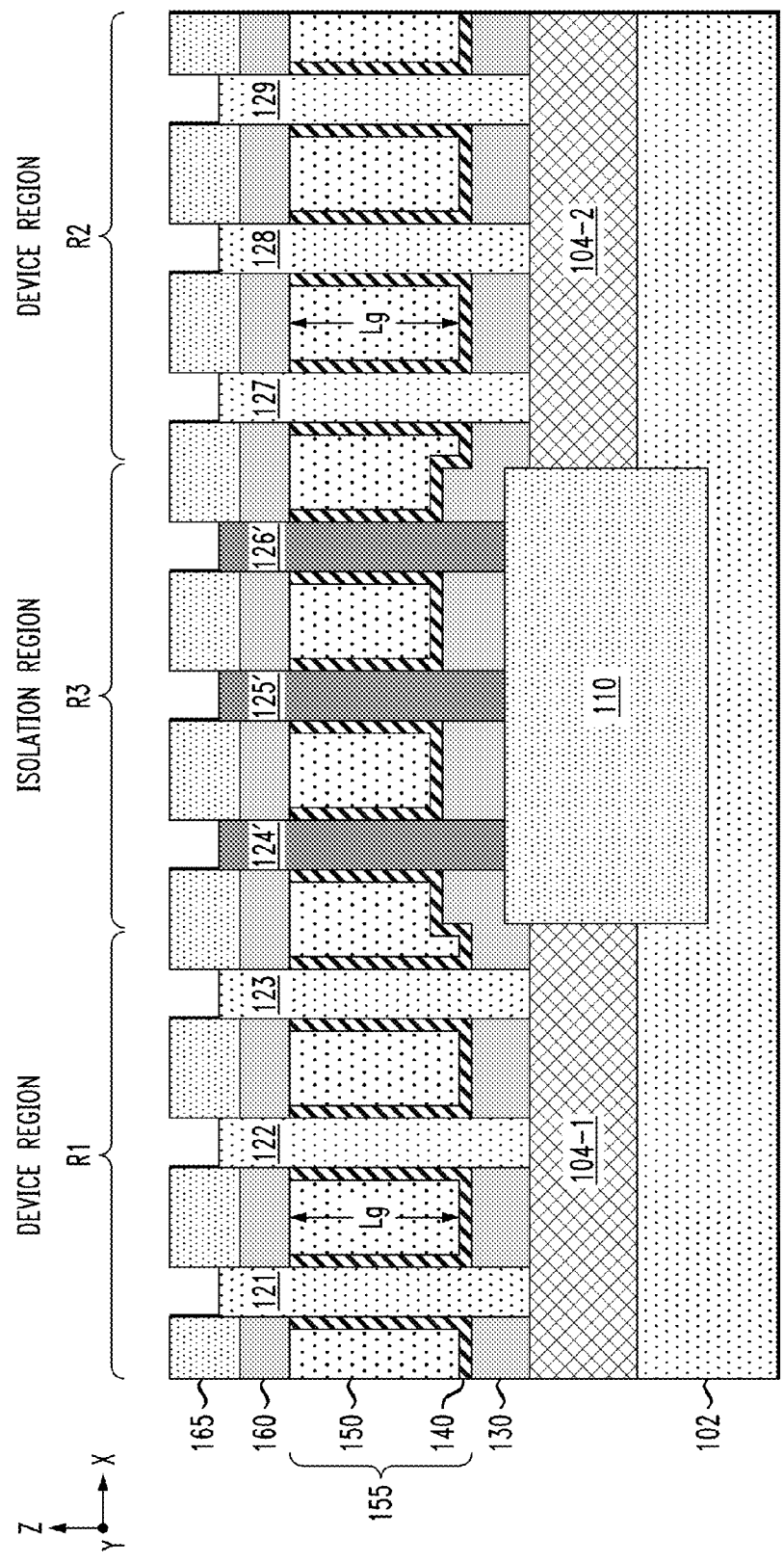

Next, FIG. 17 is a schematic cross-sectional side view of the semiconductor structure of FIG. 16 after performing an etch process to recess the insulating material 168 down to a level which exposes the upper surfaces of the vertical semiconductor fins 121, 122, 123, 127, 128, and 129 in the active device regions R1 and R2. This etch process also results in recessing the upper surfaces of the vertical dummy fins 124', 125', and 126' in the isolation region R3 to be substantially level with the upper surfaces of the vertical semiconductor fins 121, 123, 123, 127, 128, and 129 in the active device regions R1 and R2, as shown in FIG. 17.

Following the recess process, the layer of insulating material 165 is removed to expose upper portions of the vertical semiconductor fins 121, 123, 123, 127, 128, and 129 on which the upper source/drain regions are epitaxially grown. For example, FIG. 18 is a schematic cross-sectional side view of the semiconductor structure of FIG. 17 after removing the layer of insulating material 165 on the surface of the upper insulating spacer 160, and epitaxially growing the upper source/drain regions 170-1 and 170-2 on the exposed upper portions of the vertical semiconductor fins 121, 122, 123, 127, 128, and 129 in the respective active device regions R1 and R2.

In one embodiment, the upper source/drain regions 170-1 and 170-2 are formed by epitaxially growing doped semiconductor layers (e.g., doped SiGe) on the exposed upper portions of the vertical semiconductor fins 121, 122, 123, 127, 128, and 129 using known selective growth techniques in which the epitaxial material is not grown on the exposed surfaces of upper insulating spacer 160 or on the exposed upper portions of the vertical dummy fins 124', 125' and 126'. The type of epitaxial semiconductor material that is used to form the upper source/drain regions 170-1 and 170-2 will vary depending on various factors including, but are not limited to, the type of material of the vertical semiconductor fins 121, 122, 123, 127, 128, and 129, the device type (e.g., n-type or p-type) of the vertical FET devices to be formed in the active device regions R1 and R2, etc.

Figure 18:
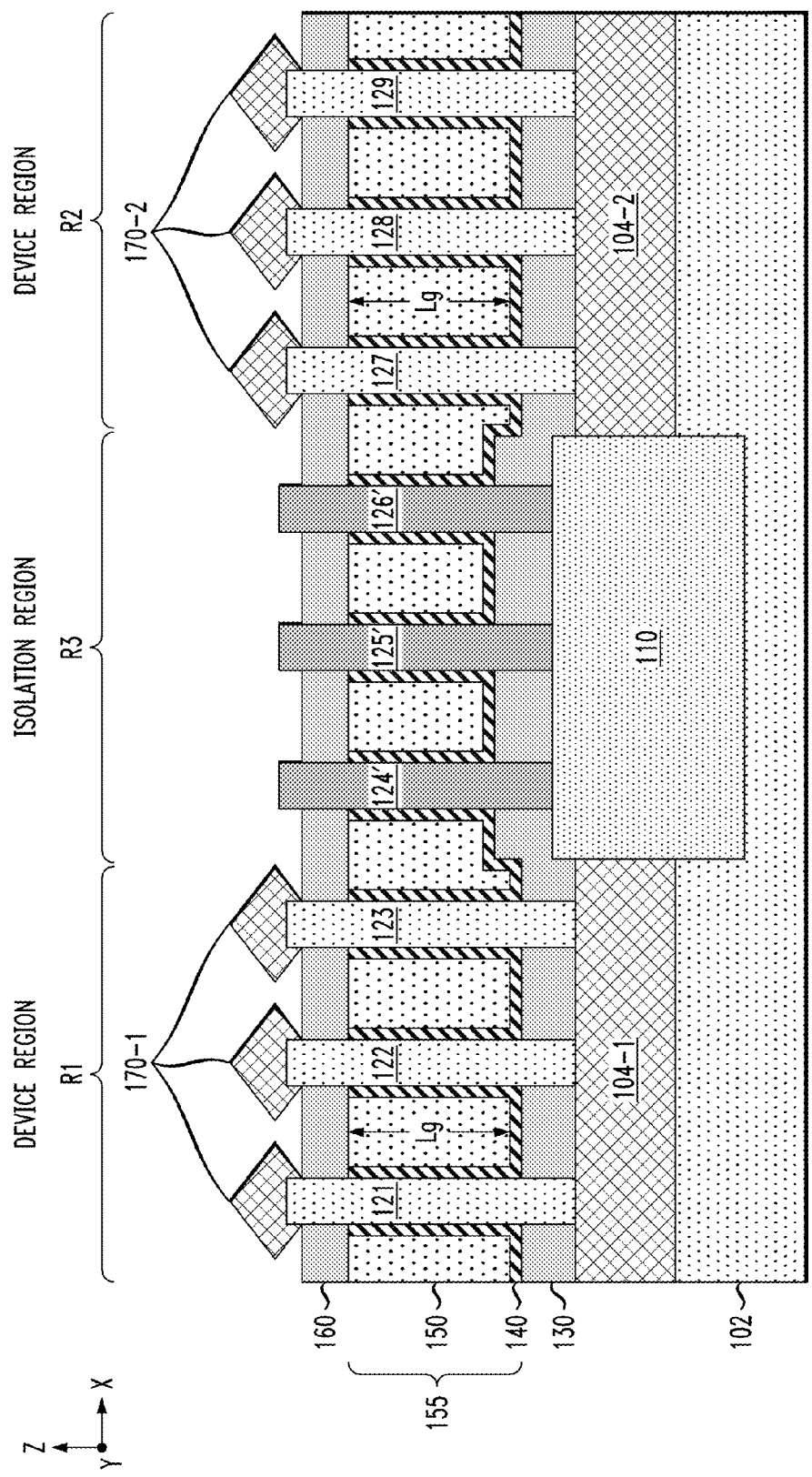
FIG. 18 is a schematic cross-sectional side view of the semiconductor structure of FIG. 17 after removing the layer of insulating material on the upper insulating spacer, and epitaxially growing upper source/drain regions on the exposed upper portions of the vertical semiconductor fins in the active device regions.

As shown in the example embodiment of FIG. 18, the upper source/drain regions 170-1 and 170-2 comprise diamond-shaped (or faceted) source/drain structures, which can be formed using known techniques in which the process conditions are adjusted to vary the growth rate on surfaces with different crystallographic orientations, as is known in the art. The epitaxial growth may continue until merger of the epitaxial grown layers on the upper surfaces of adjacent vertical semiconductor fin structures. In some embodiments, the faceted source/drain regions 170-1 and 170-2 may be in-situ doped during epitaxial growth by adding a dopant gas to the source deposition gas (i.e., the Si-containing gas). Exemplary dopant gases may include a boron-containing gas such as $BH_3$ for pFETs or a phosphorus or arsenic containing gas such as $PH_3$ or $AsH_3$ for nFETs, wherein the concentration of impurity in the gas phase determines its concentration in the deposited film. Alternatively, the upper source/drain regions 170-1 and 170-2 can be doped ex-situ using, for example, ion implantation, gas phase doping, plasma doping, plasma immersion ion implantation, cluster doping, infusion doping, liquid phase doping, solid phase doping, etc. In one non-limiting embodiment, the doping concentration can range from about $1\times10^{19}/cm^3$ to about $4\times10^{21}/cm^3$. While the example embodiment of FIG. 18 shows diamond-shaped epitaxial structures, the upper source/drain regions 170-1 and 170-2 can be formed to have other types of shapes.

Following the formation of the semiconductor structure shown in FIG. 18, any known sequence of processing steps can be implemented to complete the fabrication the semiconductor integrated circuit device as shown in FIG. 1, the details of which are not needed to understand embodiments of the invention. Briefly, by way of example, referring back to FIG. 1, after forming the upper source/drain regions 170-1 and 170-2, a FEOL process and MOL (middle of the line) process are continued to form the insulating layer 180, pattern the insulating layer 180 to form trenches and/or via openings to expose the upper source/drain regions 170-1 and 170-2, and then fill the trenches and/or via openings with conductive material to form the vertical source/drain contacts 180-1 and 180-2. In addition, vertical contacts (not shown) to the lower source/drain regions 104-1 and 104-2 and the different portions of the conductive gate structure 155 in the active device regions R1 and R2 are fabricated using known methods. Following formation of the vertical device contacts, a BEOL (back end of line) interconnect structure is formed to provide connections to/between the vertical FET devices and other active or passive devices that are formed as part of the FEOL layer in the active device regions R1 and R2.

It is to be understood that the methods discussed herein for fabricating vertical FET devices with uniform structural profiles can be incorporated within semiconductor processing flows for fabricating other types of semiconductor devices and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

What is claimed is:

1. A method for fabricating a semiconductor device, comprising:

forming a substrate comprising a lower source/drain layer disposed between a base semiconductor substrate and a first layer of semiconductor material;

forming a shallow trench isolation (STI) layer through a portion of the first layer of semiconductor material, the lower source/drain layer and into an upper portion of the semiconductor substrate to form an isolation region, wherein the isolation region defines a first device region comprising a first lower source/drain region and a second device region comprising a second lower source/drain region;

recessing the STI layer;

forming a second layer of semiconductor material on the recessed STI layer in the isolation region;

concurrently patterning the first and second layers of semiconductor material using a first etch process to form an array of vertical semiconductor tins in the first and second device regions and the isolation region;

forming a lower insulating spacer on the first and second lower source/drain regions and the STI layer;

forming a conductive gate structure on the lower insulating spacer and surrounding sidewalls of the vertical semiconductor fins in the first and second device regions and the isolation region;

forming an upper insulating spacer on the conductive gate structure;

etching away the vertical semiconductor fins in the isolation region using a second etch process which is selective to the vertical semiconductor fins in the first and second device regions, to form trenches down to the STI layer in the isolation, region; and filling the trenches in the isolation region with insulating material to form vertical dummy fins in the isolation region.

2. The method of claim 1, further comprising epitaxially growing upper source/drain regions on exposed upper portions of the vertical semiconductor tins in the first and second device regions.

3. The method of claim 1, wherein the first layer of semiconductor material comprises a layer of monocrystalline semiconductor material, and wherein the second layer of semiconductor material comprises a layer of amorphous or polycrystalline semiconductor material.

4. The method of claim 1, wherein the first layer of semiconductor material comprises monocrystalline silicon and wherein the second layer of semiconductor material comprises amorphous silicon germanium or polycrystalline silicon germanium.

5. The method of claim 1, wherein the first etch process comprises a dry etch process having an etch chemistry that is non-selective to the first and second layers of semiconductor material, and wherein the second etch process comprises a dry or wet etch process having an etch chemistry that is selective to the first layer of semiconductor material.

6. The method of claim 1, wherein the vertical semiconductor fins in the first and second device regions and the vertical dummy tins in the isolation region have substantially a same width and are spaced by substantially a same pitch.

7. The method of claim 1, wherein filling the trenches in the isolation region with insulating material to form the vertical dummy fins in the isolation region comprises filling the trenches with a nitride material.

8. The method of claim 1, wherein forming the conductive gate structure on the lower insulating spacer and surrounding the sidewalls of the vertical semiconductor fins in the first and second device regions and the isolation region, comprises:

forming a conformal layer of gate dielectric material to cover the vertical semiconductor fins and the lower insulating spacer in the first and second device regions and the isolation region;

depositing a layer of conductive material to fill spaces between the vertical semiconductor fins in the first and second device regions and the isolation region with conductive material; and recessing the layer of conductive material down to a target level below an upper surface of the vertical semiconductor fins in the first and second device regions and the isolation region, wherein the target level defines a gate length of the conductive gate structure of the vertical semiconductor fins in the first and second device regions.

9. The method of claim 1, wherein forming the substrate comprises epitaxially growing the lower source/drain layer on a surface of the base semiconductor substrate; and epitaxially growing the first layer of semiconductor material on the lower source/drain layer.

\* \* \* \* \*